US010944381B2

(12) United States Patent
Tsukamoto et al.

(10) Patent No.: US 10,944,381 B2
(45) Date of Patent: Mar. 9, 2021

(54) ACOUSTIC WAVE FILTER DEVICE, MULTIPLEXER, RADIO-FREQUENCY FRONT END CIRCUIT, AND COMMUNICATION DEVICE

(71) Applicant: Murata Manufacturing Co., Ltd., Kyoto (JP)

(72) Inventors: Hideki Tsukamoto, Kyoto (JP); Koji Nosaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 139 days.

(21) Appl. No.: 16/353,088

(22) Filed: Mar. 14, 2019

(65) Prior Publication Data
US 2019/0267969 A1   Aug. 29, 2019

Related U.S. Application Data

(63) Continuation of application No. PCT/JP2017/033978, filed on Sep. 20, 2017.

(30) Foreign Application Priority Data

Sep. 29, 2016 (JP) .............................. JP2016-192301

(51) Int. Cl.
H03H 9/54 (2006.01)
H03H 9/02 (2006.01)
(Continued)

(52) U.S. Cl.
CPC ........ H03H 9/542 (2013.01); H03H 9/02007 (2013.01); H03H 9/205 (2013.01);
(Continued)

(58) Field of Classification Search
CPC ........... H03H 9/02007; H03H 9/14541; H03H 9/205; H03H 9/54; H03H 9/542;
(Continued)

(56) References Cited

U.S. PATENT DOCUMENTS 5,999,069 A * 12/1999 Ushiroku ............. H03H 9/6483
333/193
6,023,611 A    2/2000 Bolin et al.
(Continued)

FOREIGN PATENT DOCUMENTS

JP    11-312951 A  * 11/1999
JP    2001-512642 A    8/2001
(Continued)

OTHER PUBLICATIONS

K. Baraka et al.; "Reconfiguration of Bulk Acoustic Wave Filters Using RF-MEMS Switches and CMOS Transistors"; Proceedings of the 8th IEEE International NEWCAS Conference 2010; Date of Conference Jun. 20-23, 2010, pp. 169-172 and one page IEEE abstract. (Year: 2010).*

(Continued)

Primary Examiner — Barbara Summons
(74) Attorney, Agent, or Firm — Pearne & Gordon LLP

(57) ABSTRACT

A filter includes a series arm resonator, a first parallel arm resonance circuit and a second parallel arm resonance circuit. The each of the first parallel arm resonance circuit and the second parallel arm resonance circuit includes: a parallel arm resonator that is connected to a node; a pair of elements consisting of a capacitor and a switch, which are connected in parallel with each other, that is connected in series with the parallel arm resonator; and an inductor that is provided on a path that connects the node and ground to each other via the switch. The inductance value of the inductor of the first parallel arm resonance circuit and the inductance value of the inductor of the second parallel arm resonance circuit are substantially equal to each other.

20 Claims, 16 Drawing Sheets

(51) Int. Cl.
*H03H 9/205* (2006.01)
*H03H 9/64* (2006.01)
*H03H 9/70* (2006.01)
*H03H 9/72* (2006.01)
*H03H 9/56* (2006.01)
*H03H 9/60* (2006.01)

(52) U.S. Cl.
CPC .............. *H03H 9/54* (2013.01); *H03H 9/545* (2013.01); *H03H 9/568* (2013.01); *H03H 9/605* (2013.01); *H03H 9/64* (2013.01); *H03H 9/6403* (2013.01); *H03H 9/6483* (2013.01); *H03H 9/706* (2013.01); *H03H 9/725* (2013.01)

(58) Field of Classification Search
CPC .......... H03H 9/568; H03H 9/605; H03H 9/64; H03H 9/6403; H03H 9/6483; H03H 9/706; H03H 9/72; H03H 9/725; H03H 9/545; H03H 9/70
USPC ................................. 333/133, 193, 195, 189
See application file for complete search history.

(56) References Cited

U.S. PATENT DOCUMENTS

| | | | |
|---|---|---|---|
| 6,472,953 B1* | 10/2002 | Sakuragawa | H03H 9/6483 333/133 |
| 6,919,777 B2* | 7/2005 | Taniguchi | H03H 9/0557 333/133 |
| RE40,036 E* | 1/2008 | Satoh | H03H 9/6483 310/313 R |
| 7,315,455 B2* | 1/2008 | Furukawa | H01L 25/50 361/760 |
| 9,246,536 B2* | 1/2016 | Caron | H04B 1/52 |
| 9,866,366 B2* | 1/2018 | Pehlke | H04L 5/14 |
| 10,715,110 B2* | 7/2020 | Horita | H04B 1/0057 |
| 2002/0180562 A1* | 12/2002 | Taniguchi | H03H 9/6433 333/193 |
| 2003/0227358 A1* | 12/2003 | Inose | H03H 9/6423 333/193 |
| 2007/0210876 A1 | 9/2007 | Yahata et al. | |
| 2009/0251235 A1 | 10/2009 | Belot et al. | |
| 2019/0214969 A1* | 7/2019 | Wada | H03H 9/542 |
| 2019/0222198 A1* | 7/2019 | Tsukamoto | H03H 9/205 |

FOREIGN PATENT DOCUMENTS

| | | |
|---|---|---|
| JP | 2004-72549 A | 3/2004 |
| JP | 2010-062816 A | 3/2010 |
| JP | 2013-239839 A | 11/2013 |
| WO | 2005/125008 A1 | 12/2005 |

OTHER PUBLICATIONS

English language machine translation of JP 2010-062816 A, published Mar. 18, 2010, 13 pages. (Year: 2010).*
International Search Report for International Application No. PCT/JP2017/033978 dated Dec. 12, 2017.
Written Opinion for International Application No. PCT/JP2017/033978 dated Dec. 12, 2017.

* cited by examiner

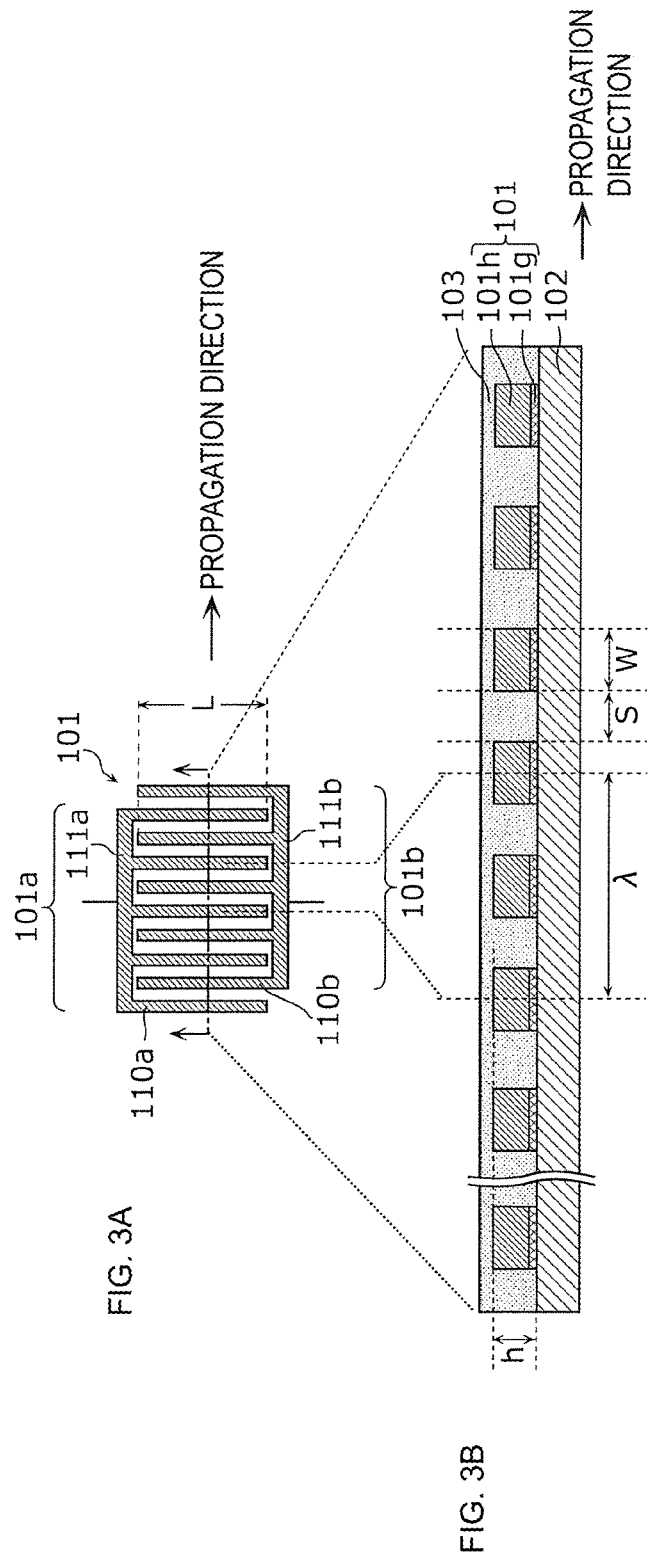

FIG. 15A
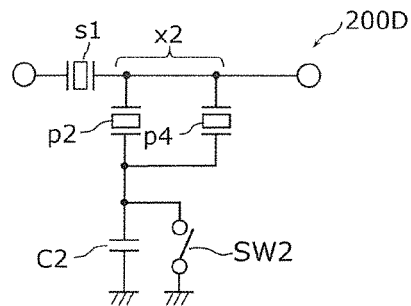
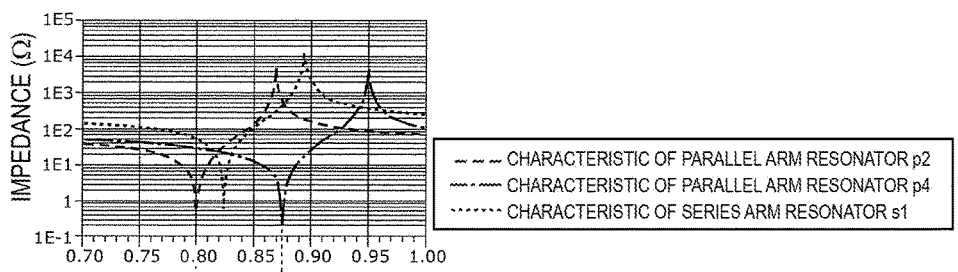
FIG. 15BA
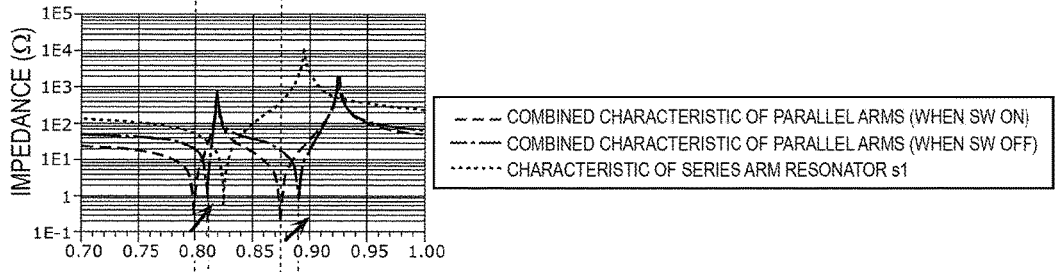
FIG. 15BB
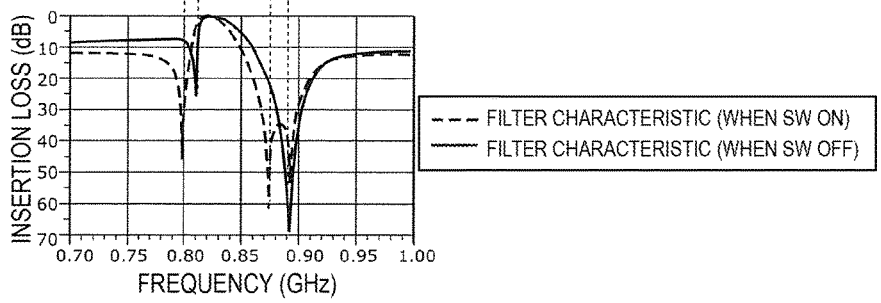
FIG. 15BC

ACOUSTIC WAVE FILTER DEVICE, MULTIPLEXER, RADIO-FREQUENCY FRONT END CIRCUIT, AND COMMUNICATION DEVICE

This is a continuation of International Application No. PCT/JP2017/033978 filed on Sep. 20, 2017 which claims priority from Japanese Patent Application No. 2016-192301 filed on Sep. 29, 2016. The contents of these applications are incorporated herein by reference in their entireties.

BACKGROUND

Technical Field

The present disclosure relates to an acoustic wave filter device including a resonator, and to a multiplexer, a radio-frequency front end circuit, and a communication device.

In the related art, acoustic wave filter devices that employ acoustic waves are widely used in band pass filters and the like that are arranged in the front end units of mobile communication devices. In addition, radio-frequency front end circuits and communication devices have been implemented that include a plurality of acoustic wave filter devices in order to support combinations such as multiple modes, multiple bands, and so on.

For example, an acoustic wave filter device that supports multiple bands is known that is configured such that a pair of elements consisting of a capacitor and a switch, which are connected in parallel with each other, is serially connected to a parallel arm resonance circuit (parallel arm resonator) of a ladder filter formed of bulk acoustic wave (BAW) resonators (for example, refer to Patent Document 1). The thus-configured acoustic wave filter device forms a variable-frequency acoustic wave filter device that enables the frequency of a pass band and the frequency of an attenuation band on the low-frequency-side of the pass band to be changed in accordance with whether a switch is in a conductive state or a non-conductive state.

Patent Document 1: US Patent Application Publication No. 2009/0251235

BRIEF SUMMARY

Together with support for multiple bands and so forth in recent years, there is a demand that the attenuation amount of an attenuation band be increased when the frequency of a pass band and the frequency of the low-frequency side of the pass band are made variable in accordance with whether a switch is in a conductive state or a non-conductive state.

However, in the above-described configuration of the related art, in the case where the inductance values of paths that connect parallel arm resonators and switches to each other in the parallel arms of the acoustic wave filter device are different from each other, there is a problem in that the attenuation amount of an attenuation band is small when the frequency of the pass band and the frequency of the attenuation band are shifted toward the low-frequency side by switching a switch.

Accordingly, the present disclosure provides an acoustic wave filter device and so forth that can increase the attenuation amount of an attenuation band when switching the frequency of a pass band and the frequency of the attenuation band to lower frequencies.

An acoustic wave filter device according to an embodiment of the present disclosure includes: a first series arm resonance circuit provided on a path that connects a first input/output terminal and a second input/output terminal to each other; a first parallel arm resonance circuit that is connected between a first node, which is closer to the first input/output terminal than the first series arm resonance circuit, and ground among nodes on the path that connects the first input/output terminal and the second input/output terminal to each other; and a second parallel arm resonance circuit that is connected between a second node, which is closer to the second input/output terminal than the first series arm resonance circuit, and ground among the nodes on the path that connects the first input/output terminal and the second input/output terminal to each other. The first parallel arm resonance circuit includes a first parallel arm resonator that is connected to the first node, a pair of elements consisting of a first impedance element and a first switch, which are connected in parallel with each other, that is connected in series with the first parallel arm resonator between the first node and ground, and a first inductor that is provided on a path that connects the first node and ground to each other via the first switch. The second parallel arm resonance circuit includes a second parallel arm resonator that is connected to the second node, a pair of elements consisting of a second impedance element and a second switch, which are connected in parallel with each other, that is connected in series with the second parallel arm resonator between the second node and ground, and a second inductor that is provided on a path that connects the second node and ground to each other via the second switch. An inductance value of the first inductor and an inductance value of the second inductor are substantially equal to each other.

According to this configuration, the acoustic wave filter device is formed of the first series arm resonance circuit, the first parallel arm resonance circuit, and the second parallel arm resonance circuit, and has a plurality of bandpass characteristics having different pass bands from each other in accordance with whether the first switch and the second switch are in a conductive state or a non-conductive state. For example, in the case where the first switch and the second switch are in a conductive state, the first impedance element and the second impedance element are short-circuited by the first switch and the second switch, and a first bandpass characteristic is generated in which there is no effect from the first impedance element and the second impedance element. On the other hand, in the case where the first switch and the second switch are in a non-conductive state, a second bandpass characteristic is generated that is different from the first bandpass characteristic and in which there is an effect from the first impedance element and the second impedance element. Furthermore, the pass bands of the first bandpass characteristic and the second bandpass characteristic are formed by an anti-resonant frequency of the first parallel arm resonance circuit and an anti-resonant frequency of the second parallel arm resonance circuit. Specifically, the pass bands are formed by anti-resonant frequencies of the first parallel arm resonator of the first parallel arm resonance circuit and the second parallel arm resonator of the second parallel arm resonance circuit. On the other hand, an attenuation band on the low-frequency side of the pass band in the first bandpass characteristic and the second bandpass characteristic is formed by a resonant frequency of the first parallel arm resonance circuit and a resonant frequency of the second parallel arm resonance circuit. Specifically, the attenuation band is formed by the resonant frequencies of the first parallel arm resonator and the second parallel arm resonator.

For example, it is assumed that the resonant frequency of the first parallel arm resonator and the resonant frequency of the second parallel arm resonator are substantially equal frequencies. In the case where the first switch is in a non-conductive state, the resonant frequency of the first parallel arm resonance circuit (referred to as first resonant frequency) is a frequency that is affected by the first impedance element. In the case where the second switch is in a non-conductive state, the resonant frequency of the second parallel arm resonance circuit (referred to as second resonant frequency) is a frequency that is affected by the second impedance element. In the case where parameters of the first impedance element and the second impedance element (capacitance values in the case where the impedance elements are capacitors and inductance values in the case where the impedance elements are inductors) are different from each other, the first resonant frequency and the second resonant frequency are spaced apart from each other, and the band width of an attenuation band on the low-frequency side of the pass band can be increased in the second bandpass characteristic. In addition, in the case where the parameters of the first impedance element and the second impedance element are substantially equal to each other, the first resonant frequency and the second resonant frequency are substantially equal frequencies and the attenuation amount of the attenuation band can be increased.

Here, when the first switch and the second switch are switched from a non-conductive state to a conductive state, the first resonant frequency is no longer affected by the first impedance element and is shifted toward the low-frequency side or the high-frequency side, and the second resonant frequency is no longer affected by the second impedance element and is shifted toward the low-frequency side or the high-frequency side. In the case where the first impedance element and the second impedance element are capacitors, the first resonant frequency and the second resonant frequency are shifted toward the low-frequency side. In the case where the first impedance element and the second impedance element are inductors, the first resonant frequency and the second resonant frequency are shifted toward the high-frequency side. At this time, although the resonant frequency of the first parallel arm resonator and the resonant frequency of the second parallel arm resonator are substantially equal frequencies, the first resonant frequency and the second resonant frequency are not substantially equal to each other when the inductance value of the first inductor (first inductance value) and the inductance value of the second inductor (second inductance value) are different from each other. In other words, the first resonant frequency and the second resonant frequency become frequencies that are spaced apart from each other due to the effect of the first inductor and the second inductor, which have different inductance values, and the attenuation amount is reduced compared with the case where the first resonant frequency and the second resonant frequency are substantially equal to each other. On the other hand, in the case where the first inductance value and the second inductance value are substantially equal, the first resonant frequency and the second resonant frequency are substantially equal frequencies. Therefore, according to this embodiment, the attenuation amount of the attenuation band can be increased when the frequency of the pass band and the frequency of the attenuation band are switched to lower frequencies.

In addition, the acoustic wave filter device may further include: a third parallel arm resonance circuit that is connected in parallel with the first parallel arm resonance circuit between the first node and ground; and a fourth parallel arm resonance circuit that is connected in parallel with the second parallel arm resonance circuit between the second node and ground. The third parallel arm resonance circuit may include a third parallel arm resonator that is connected to the first node. The fourth parallel arm resonance circuit may include a fourth parallel arm resonator that is connected to the second node. A resonant frequency of the first parallel arm resonator may be different from a resonant frequency of the third parallel arm resonator. A resonant frequency of the second parallel arm resonator may be different from a resonant frequency of the fourth parallel arm resonator.

According to this configuration, in each of a parallel circuit formed by the first parallel arm resonance circuit and the third parallel arm resonance circuit being connected in parallel with each other and a parallel circuit formed by second parallel arm resonance circuit and the fourth parallel arm resonance circuit being connected in parallel with each other, at least one frequency at which impedance is minimum and at least one frequency at which impedance is maximum are both shifted toward the low-frequency side or the high-frequency side in accordance with whether the switch element is in a conductive state or a non-conductive state. Therefore, in the first bandpass characteristic and the second bandpass characteristic, an attenuation slope defined by the frequency at which impedance is minimum and the frequency at which impedance is maximum in these circuits is shifted toward the low-frequency side or the high-frequency side while maintaining the degree of steepness. Therefore, according to this embodiment, the frequency of a pass band and the frequency of an attenuation band can be switched while suppressing an increase in insertion loss inside the pass band in accordance with switching of the switch elements between a conductive state and a non-conductive state.

Furthermore, the resonant frequency of the first parallel arm resonator may be higher than the resonant frequency of the third parallel arm resonator, and the resonant frequency of the second parallel arm resonator may be higher than the resonant frequency of the fourth parallel arm resonator.

According to this configuration, a tunable filter can be provided that, as well as being able to switch the frequency of an attenuation pole on the high-frequency side of the pass band in accordance with switching of the switch elements between a conductive state and a non-conductive state, can suppress an increase in insertion loss at the high-frequency end of the pass band.

Furthermore, the resonant frequency of the first parallel arm resonator may be lower than the resonant frequency of the third parallel arm resonator, and the resonant frequency of the second parallel arm resonator may be lower than the resonant frequency of the fourth parallel arm resonator.

According to this configuration, a tunable filter can be provided that, as well as being able to switch the frequency of an attenuation pole on the low-frequency side of the pass band in accordance with switching of the switch elements between a conductive state and a non-conductive state, can suppress an increase in insertion loss at the low-frequency end of the pass band.

In addition, the third parallel arm resonance circuit may further include a pair of elements consisting of a third impedance element and a third switch, which are connected in parallel with each other, that is connected in series with the third parallel arm resonator between the first node and ground, and a third inductor that is provided on a path that connects the first node and ground to each other via the third switch. The fourth parallel arm resonance circuit may further include a pair of elements consisting of a fourth impedance element and a fourth switch, which are connected in parallel with each other, that is connected in series with the fourth parallel arm resonator between the second node and ground, and a fourth inductor that is provided on a path that connects the second node and ground to each other via the fourth switch.

According to this configuration, a tunable filter can be provided that, as well as being able to switch the frequencies of attenuation poles on the high-frequency side of the pass band and the low-frequency side of the pass band in accordance with switching of the switch elements between a conductive state and a non-conductive state, can suppress an increase in insertion loss at the high-frequency end of the pass band and the low-frequency end of the pass band. Therefore, for example, the tunable filter can shift the center frequency of the pass band while maintaining the band width of the pass band.

In addition, an inductance value of the third inductor and an inductance value of the fourth inductor may be substantially equal to each other.

According to this configuration, the attenuation amount of an attenuation band can be increased at both the high-frequency side of the pass band and the low-frequency side of the pass band in accordance with switching of the switch elements between a conductive state and a non-conductive state.

In addition, the acoustic wave filter device may further include: a third parallel arm resonator that is connected in parallel with the first parallel arm resonator between the first node and ground; and a fourth parallel arm resonator that is connected in parallel with the second parallel arm resonator between the second node and ground. The pair of elements consisting of the first impedance element and the first switch, which are connected in parallel with each other, may be connected in series with a circuit in which the first parallel arm resonator and the third parallel arm resonator are connected in parallel with each other. The pair of elements consisting of the second impedance element and the second switch, which are connected in parallel with each other, may be connected in series with a circuit in which the second parallel arm resonator and the fourth parallel arm resonator are connected in parallel with each other. A resonant frequency of the first parallel arm resonator may be different from a resonant frequency of the third parallel arm resonator. A resonant frequency of the second parallel arm resonator may be different from a resonant frequency of the fourth parallel arm resonator.

According to this configuration, the frequencies of poles (attenuation poles) on both sides of the pass band can be switched together in accordance with switching of the switch elements between a conductive state and a non-conductive state.

Furthermore, the first inductor may be a first wiring line on a path that connects the first parallel arm resonator and ground to each other via the first switch, and the second inductor may be a second wiring line on a path that connects the second parallel arm resonator and ground to each other via the second switch.

For example, in the case where the first parallel arm resonator and the second parallel arm resonator and the first switch and the second switch are mounted on a substrate as different components, a first wiring line that connects the first parallel arm resonator and the first switch to each other and a second wiring line that connects the second parallel arm resonator and the second switch to each other may be provided on the substrate. In other words, since a first wiring line and a second wiring line that are connected between components can be used as the first inductor and the second inductor, the first inductor and the second inductor can be easily realized.

Furthermore, the acoustic wave filter device may further include a wiring substrate. At least one out of the first wiring line and the second wiring line may be partially provided on the wiring substrate or inside the wiring substrate.

According to this configuration, for example, in the case where part of the first wiring line is provided on the wiring substrate or inside the wiring substrate, the length or width of the first wiring line that is on the wiring substrate or inside the wiring substrate can be adjusted. Consequently, the inductance value of the first wiring line (first inductor) can be easily adjusted by adjusting the length or width of the first wiring line. In addition, in the case where part of the second wiring line is provided on the wiring substrate or inside the wiring substrate as well, the inductance value of the second wiring line (second inductor) can be easily adjusted by adjusting the length or width of the second wiring line.

In addition, the first parallel arm resonator and the second parallel arm resonator and the first switch and the second switch may be formed as separate chips and may be provided on the wiring substrate or inside the wiring substrate. Terminals, which respectively correspond to the first parallel arm resonator and the second parallel arm resonator, of the chip in which the first parallel arm resonator and the second parallel arm resonator are formed may be arrayed along one edge of that chip. Terminals, which respectively correspond to the first switch and the second switch, of the chip in which the first switch and the second switch are formed may be arrayed along one edge of that chip.

According to this configuration, there is no need to make one wiring line out of the first wiring line and the second wiring line longer in order to match the other wiring line and the acoustic wave filter device can be made small in size while suppressing degradation of attenuation characteristics.

Furthermore, the inductance value of the first inductor and the inductance value of the second inductor may be substantially equal to each other as a result of a length and a width of the first wiring line and a length and a width of the second wiring line being substantially equal to each other.

According to this configuration, the first inductance value and the second inductance value can be easily made substantially equal to each other by making the length and the width of the first wiring line and the length and the width of the second wiring line substantially equal to each other.

In addition, the acoustic wave filter device may further include: a second series arm resonance circuit that is provided on a path that connects the first series arm resonance circuit and the second input/output terminal to each other; and a fifth parallel arm resonance circuit that is connected between a node, which is provided on a path that connects the first series arm resonance circuit and the second series arm resonance circuit to each other, and ground. The second node may be located on a path that connects the second series arm resonance circuit and the second input/output terminal to each other. The fifth parallel arm resonance circuit may include a fifth parallel arm resonator that is connected to a node between the first node and the second node, a pair of elements consisting of a fifth impedance element and a fifth switch, which are connected in parallel with each other, that is connected in series with the fifth parallel arm resonator between that node and ground, and a fifth inductor that is provided on a path that connects that node and ground to each other via the fifth switch.

According to this configuration, the number of stages of the ladder filter structure is increased, and therefore the filter characteristics of the acoustic wave filter device can be improved.

In addition, the inductance value of the fifth inductor may be substantially equal to the inductance value of the first inductor and the inductance value of the second inductor.

According to this configuration, the attenuation amount of the attenuation band can be increased when the frequency of the pass band and the frequency of the attenuation band are switched to lower frequencies.

A multiplexer according to an embodiment of the present disclosure includes: at least one transmission filter; and at least one reception filter. At least one out of the transmission filter and the reception device is one of the acoustic wave filter devices described above.

According to this configuration, a radio-frequency front end circuit can be provided that can increase the attenuation amount of an attenuation band when the frequency of the pass band and the frequency of the attenuation band are switched to lower frequencies.

In addition, a multiplexer according to an embodiment of the present disclosure includes: one of the acoustic wave filter devices described above; and an amplification circuit that is connected to the acoustic wave filter device.

According to this configuration, a radio-frequency front end circuit can be provided that can increase the attenuation amount of an attenuation band when the frequency of the pass band and the frequency of the attenuation band are switched to lower frequencies.

In addition, a communication device according to an embodiment of the present disclosure includes: an RF signal processing circuit that processes a radio-frequency signal transmitted or received by an antenna element; and the above-described radio-frequency front end circuit, which transmits the radio-frequency signal between the antenna element and the RF signal processing circuit.

According to this configuration, there is provided a communication device that can increase the attenuation amount of the attenuation band when the frequency of the pass band and the frequency of the attenuation band are switched to lower frequencies.

With the acoustic wave filter device and so forth according to the present disclosure, the attenuation amount of an attenuation band can be increased when the frequency of the pass band and the frequency of the attenuation band are switched to lower frequencies.

BRIEF DESCRIPTION OF THE SEVERAL VIEWS OF THE DRAWINGS

FIGS. 3A and 3B are diagrams schematically illustrating the structure of resonators of embodiment 1.

FIG. 15A is a circuit configuration diagram of a filter formed of a series arm resonator and a second parallel arm resonance circuit in application example 4 of embodiment 2.

FIG. 15BA-15BC depict graphs illustrating characteristics of the filter formed of the series arm resonator and the second parallel arm resonance circuit in application example 4 of embodiment 2.

DETAILED DESCRIPTION

Figure 1:
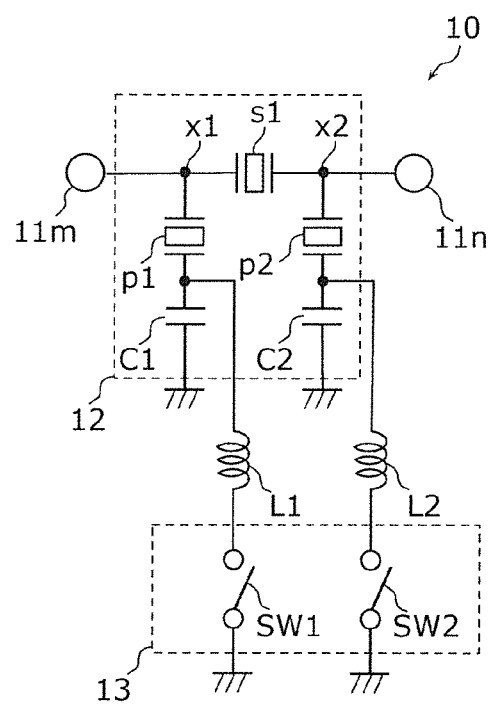
FIG. 1 is a circuit configuration diagram of a filter according to embodiment 1.

Hereafter, embodiments of the present disclosure will be described in detail using examples and the drawings. The embodiments described hereafter each illustrate a comprehensive or specific example of the present disclosure. The numerical values, shapes, materials, constituent elements, arrangements of the constituent elements, the ways in which the constituent elements are connected, and so forth described in the following embodiments are merely examples and are not intended to limit the present disclosure. Constituent elements not described in the independent claims among constituent elements in the following embodiments are described as arbitrary constituent elements. In addition, the sizes of the constituent elements illustrated in the drawings or the ratios between the sizes are not necessarily strictly accurate. Furthermore, in the drawings, configurations that are substantially the same as each other may be denoted by the same symbols and repeated description thereof may be omitted or simplified.

In addition, hereafter, "the low-frequency end of the pass band" refers to "the lowest frequency inside the pass band". Furthermore, "the high-frequency end of the pass band" refers to "the highest frequency inside the pass band". In addition, "the low-frequency side of the pass band" refers to "frequencies that are outside the pass band and lower than the pass band". Furthermore, "the high-frequency side of the pass band" refers to "frequencies that are outside the pass band and higher than the pass band". In addition, hereafter, "the side located at low frequencies" may be referred to as "the low-frequency side" and "the side located at high frequencies" may be referred to as "the high-frequency side".

Furthermore, hereafter, switch elements are described as ideal elements in which the impedance is infinite when the switch element is in a conductive (on) state and the impedance is zero when the switch element is in a non-conductive (off) state. In reality, a switch element will have parasitic components such as a capacitive component when the switch element is in a non-conductive state, and an inductance component and a resistive component when the switch element is in a conductive state, and therefore in reality slightly different characteristics will be obtained compared to those obtained when a switch element assumed to be an ideal element is used.

Furthermore, in this specification, it is intended that "substantially equal" include things that are completely identical as well as things that are recognized as being practically identical.

Embodiment 1

[1. Circuit Configuration of Filter]

FIG. 1 is a circuit configuration diagram of a filter 10 according to embodiment 1.

A filter 10 is a radio-frequency filter circuit that is arranged in a front end unit of a cellular phone that supports multiple modes/multiple bands, for example. The filter 10 is, for example, a band pass filter that is built into a cellular phone that supports multiple bands defined by a communication standard such as long term evolution (LTE), allows a radio-frequency signal of a prescribed band to pass therethrough, and filters out radio-frequency signals that would interfere with communication. The filter 10 is an acoustic wave filter device in which acoustic wave resonators are used.

Furthermore, the filter 10 is a variable-frequency filter (tunable filter) in which the pass band can be changed. As will be described below, the filter 10 has switch elements and the pass band can be switched in accordance with whether the switch elements are in a conductive state or a non-conductive state. Here, the switch elements are switched between being in a conductive state and a non-conductive state in accordance with a control signal from a control unit such as a radio frequency integrated circuit (RFIC).

As illustrated in the figure, the filter 10 includes: a series arm resonator s1, a parallel arm resonator p1, a capacitor C1, an inductor L1, a switch SW1, a parallel arm resonator p2, a capacitor C2, an inductor L2, and a switch SW2.

The series arm resonator s1 is a first series arm resonance circuit that is provided on a path that connects an input/output terminal 11m (first input/output terminal) and an input/output terminal 11n (second input/output terminal) to each other. In other words, the series arm resonator s1 is a resonator that is provided on a path that connects the input/output terminal 11m and the input/output terminal 11n to each other. For example, the input/output terminal 11m is an input terminal to which a radio-frequency signal is input and the input/output terminal 11n is an output terminal from which a radio-frequency signal is output. In addition, a series arm resonance circuit includes a series arm resonator(s) and the series arm resonator(s) includes one or more acoustic wave resonators. The series arm resonance circuit may be a resonance circuit that is formed of inductors and capacitors and has a resonant frequency and an anti-resonant frequency as represented by the Butterworth Van Dyke (BVD) model of a resonator. In this embodiment, the series arm resonance circuit is formed of one acoustic wave resonator but may instead be formed of acoustic wave resonators divided into series or parallel resonators or a longitudinal coupling resonator formed of a plurality of acoustic wave resonators. In the case where acoustic wave resonators that are divided into series and parallel resonators are used, the electric power handling capability of the filter can be improved. In the case of a filter that uses a longitudinal coupling resonator, it is possible to more easily adjust the filter to required filter characteristics such as attenuation intensity.

The parallel arm resonator p1 is a first parallel arm resonator that is connected between a first node (node x1 in FIG. 1) that is on the input/output terminal 11m side of the series arm resonator s1 and ground (reference terminal) among nodes on the path that connects the input/output terminal 11m and the input/output terminal 11n to each other. In other words, the parallel arm resonator p1 is a resonator that is provided in a parallel arm resonance circuit that connects the node x1 on the series arm and ground to each other. In this embodiment, the node x1 is a node that is on the input/output terminal 11m side of the series arm resonator s1.

The parallel arm resonator p2 is a second parallel arm resonator that is connected between a second node (node x2 in FIG. 1) that is on the input/output terminal 11n side of the series arm resonator s1 and ground among the nodes on the path that connects the input/output terminal 11m and the input/output terminal 11n to each other. In other words, the parallel arm resonator p2 is a resonator that is provided in a parallel arm resonance circuit that connects the node x2 on the series arm and ground to each other. In this embodiment, the node x2 is a node that is on the input/output terminal 11n side of the series arm resonator s1.

Hereafter, for convenience, a singular point where the impedance of a resonator or a resonance circuit is minimum (ideally, a point where the impedance is 0) will be referred to as a "resonant frequency". In addition, a singular point where the impedance is maximum (ideally, a point where the impedance is infinite) will be referred to as an "anti-resonant frequency".

The series arm resonator s1 and the parallel arm resonators p1 and p2 are acoustic wave resonators that have resonant frequencies and anti-resonant frequencies and are each formed of a surface acoustic wave (SAW) resonator, a bulk acoustic wave (BAW) resonator, or a film bulk acoustic resonator (FBAR). Here, the series arm resonator s1 and the parallel arm resonators P1 to P2 are each formed of a surface acoustic wave resonator. Consequently, the filter 10 can be formed using interdigital transducer (IDT) electrodes formed on a substrate having piezoelectricity, and therefore a small-sized low-profile filter circuit can be realized that has a bandpass characteristic with a high degree of steepness. A substrate having piezoelectricity is a substrate having piezoelectricity at at least the surface thereof. For example, the substrate may have a piezoelectric thin film at the surface thereof and may be formed of multilayer body consisting of the piezoelectric thin film, a film having a different acoustic velocity, a support substrate, and so on. In addition, for example, the substrate may be a multilayer body consisting of a high-acoustic-velocity support substrate and a piezoelectric thin film formed on the high-acoustic-velocity support substrate, a multilayer body consisting of a high-acoustic-velocity support substrate, a low-acoustic-velocity film formed on the high-acoustic-velocity support substrate, and a piezoelectric thin film formed on the low-acoustic-velocity film, or a multilayer body consisting of a support substrate, a high-acoustic-velocity film formed on the support substrate, a low-acoustic-velocity film formed on the high-acoustic-velocity film, and a piezoelectric thin film formed on the low-acoustic-velocity film. The substrate may instead have piezoelectricity throughout the entirety thereof.

The parallel arm resonators p1 and p2 are designed such that anti-resonant frequencies thereof are located inside the pass band of the filter 10 and the resonant frequencies thereof are located on the low-frequency side of the pass band. The series arm resonator s1 is designed such that the resonant frequency thereof is located inside the pass band of the filter 10 and the anti-resonant frequency thereof is located on the high-frequency side of the pass band. Thus, the pass band is formed by the anti-resonant frequencies of the parallel arm resonators p1 and p2 and the resonant frequency of the series arm resonator s1, an attenuation pole on the low-frequency side of the pass band is formed by the resonant frequencies of the parallel arm resonators p1 and p2 and an attenuation pole on the high-frequency side of the pass band is formed by the anti-resonant frequency of the series arm resonator s1.

In this embodiment, the capacitor C1 is a first impedance element that is serially connected to the parallel arm resonator p1 and the capacitor C2 is a second impedance element that is serially connected to the parallel arm resonator p2. The variable frequency width of the attenuation pole on the low-frequency side of the pass band of the filter 10 depends on constants of the capacitors C1 and C2, and for example, the variable frequency width becomes larger as the constants of the capacitors C1 and C2 become smaller. Therefore, the constants of the capacitor C1 and C2 can be appropriately decided upon in accordance with the frequency specifications required for the filter 10. In addition, the capacitors C1 and C2 may be variable capacitors such as varicaps or digitally tunable capacitors (DTC). In this way, it is possible to finely adjust the variable frequency width.

The impedance elements are not limited to being capacitors and may instead be inductors, for example. In the case where inductors are used as the impedance elements, the direction in which the pass band is shifted when the switch elements are switched between a conductive state and a non-conductive state is different from that in the case where capacitors are used. Specifically, when the switch elements are switched from the conductive state to the non-conductive state, the low-frequency-side attenuation pole of the pass band is shifted toward the high-frequency side when capacitors are used and is shifted toward the low-frequency side when inductors are used. In addition, the variable frequency width of the pass band will depend on the constants of the inductors, and the variable frequency width will become larger as the constants of the inductors become larger, for example. Therefore, the constants of the inductors can be appropriately decided upon in accordance with the frequency specifications required for the filter 10. Furthermore, in this case, the inductors may be variable inductors that use a micro-electromechanical system (MEMS). In this way, it is possible to finely adjust the variable frequency width.

The switch SW1 is a first switch, has one terminal that is connected to a connection node between the parallel arm resonator p1 and the capacitor C1 via the inductor L1 and another terminal that is connected to ground, and is, for example, a single-pole single-throw (SPST) switch element. The switch SW2 is a second switch, has one terminal that is connected to a connection node between the parallel arm resonator p2 and the capacitor C2 via the inductor L2 and another terminal that is connected to ground, and is, for example, a single-pole single-throw (SPST) switch element. The switches SW1 and SW2 are switched between a conductive state and a non-conductive state using a control signal from a control unit (not illustrated), and as a result paths between the respective connection nodes and ground are put into a conductive or non-conductive state.

For example, the switches SW1 and SW2 may be field effect transistor (FET) switches composed of GaAs or a complementary metal oxide semiconductor (CMOS) or may be diode switches.

The capacitor C1 and the switch SW1 are connected in parallel with each other and thereby form a pair of elements, and the capacitor C1 and the switch SW1 forming this pair of elements are connected in series with the parallel arm resonator p1 between the node x1 and ground. In addition, the capacitor C2 and the switch SW2 are connected in parallel with each other and thereby form a pair of elements, and the capacitor C2 and the switch SW2 forming this pair of elements are connected in series with the parallel arm resonator p2 between the node x2 and ground.

The inductor L1 is a first inductor that is provided on a path that connects the node x1 and ground to each other via the switch SW1. A circuit formed by the inductor L1 and the switch SW1 being connected in series with each other is connected in parallel with the capacitor C1. The inductor L1 is for example a wiring line (first wiring line) on a path that connects the parallel arm resonator p1 and ground to each other via the switch SW1. Specifically, the first wiring line is a wiring line that connects a connection node between the parallel arm resonator p1 and the capacitor C1, and the switch SW1 to each other. The inductor L2 is a second inductor that is provided on a path that connects the node x2 and ground to each other via the switch SW2. A circuit formed by the inductor L2 and the switch SW2 being connected in series with each other is connected in parallel with the capacitor C2. The inductor L2 is for example a wiring line (second wiring line) on a path that connects the parallel arm resonator p2 and ground to each other via the switch SW2. Specifically, the second wiring line is a wiring line that connects a connection node between the parallel arm resonator p2 and the capacitor C2, and the switch SW2 to each other.

In addition, the inductance value of the inductor L1 (referred to as first inductance value) and the inductance value of the inductor L2 (referred to as second inductance value) are substantially equal. Specifically, the first inductance value and the second inductance value are substantially equal as a result of the length and the width of the first wiring line and the length and the width of the second wiring line being substantially equal. "The first inductance value and the second inductance value are substantially equal" includes cases where the difference between the first inductance value and the second inductance value is 10% or less, for example.

The parallel arm resonator p1, the capacitor C1, the switch SW1, and the inductor L1 form a first parallel arm resonance circuit that is connected between the node x1, which is on the path (on the series arm) that connects the input/output terminal 11m and the input/output terminal 11n to each other, and ground.

In other words, the first parallel arm resonance circuit is provided in one parallel arm that connects the series arm and ground to each other. The parallel arm resonator p2, the capacitor C2, the switch SW2, and the inductor L2 form a second parallel arm resonance circuit that is connected between the node x2, which is on the path (on the series arm) that connects the input/output terminal 11m and the input/output terminal 11n to each other, and ground. In other words, the second parallel arm resonance circuit is provided in one parallel arm that connects the series arm and ground to each other.

Hereafter, not only in the case of a resonator as a standalone unit but also in the case of a parallel arm resonance circuit formed of a resonator and an impedance element, for convenience, a singular point where the combined impedance of the resonator and the impedance element is minimum (ideally, a point where the impedance is 0) will be referred to as a "resonant frequency". In addition, a singular point where the combined impedance is maximum (ideally, a point where the impedance is infinite) will be referred to as an "anti-resonant frequency".

As described above, the parallel arm resonators p1 and p2 are designed such that the anti-resonant frequencies thereof are located inside the pass band of the filter 10 and the resonant frequencies are located on the low-frequency side of the pass band of the filter 10, and therefore the anti-resonant frequencies of the first parallel arm resonance circuit and the second parallel arm resonance circuit are located inside the pass band of the filter 10 and the resonant frequencies of the first parallel arm resonance circuit and the second parallel arm resonance circuit are located on the low-frequency side of the pass band of the filter 10. Thus, the pass band is formed by the anti-resonant frequencies of the first parallel arm resonance circuit and the second parallel arm resonance circuit and the resonant frequency of the series arm resonator s1, and the attenuation pole on the low-frequency side of the pass band is formed by the resonant frequencies of the first parallel arm resonance circuit and the second parallel arm resonance circuit.

Furthermore, in the first parallel arm resonance circuit and the second parallel arm resonance circuit, the frequency at which the impedance is minimum is shifted toward the low-frequency side or the high-frequency side in accordance with whether the switches SW1 and SW2 are in a conductive state or a non-conductive state. In other words, the first parallel arm resonance circuit and the second parallel arm resonance circuit can change the frequency of the attenuation pole on the low-frequency side of the pass band of the filter 10. This will be described later in conjunction with the characteristics of the filter 10.

The parallel arm resonators p1 and p2 and the switches SW1 and SW2 are formed in separate chips. Specifically, as illustrated in FIG. 1, for example, the series arm resonator s1, the parallel arm resonators p1 and p2, and the capacitors C1 and C2 are formed in the same chip 12, and the switches SW1 and SW2 are formed in the same chip 13. The chips 12 and 13 are provided on a wiring substrate 16 or inside the wiring substrate 16. The inductor L1 (first wiring line) and the inductor L2 (second wiring line) are provided on the wiring substrate 16 or inside the wiring substrate 16 on which the chip 12 and the chip 13 are mounted. In other words, since the filter 10 is formed of the chips 12 and 13 and the wiring substrate 16 for example, the filter 10 can made small in size.

Figure 2A:
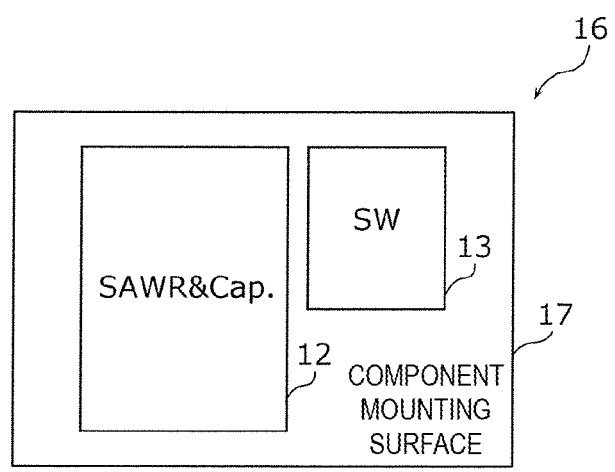
FIG. 2A is a plan view illustrating a component mounting surface of a wiring substrate on which chips that form the filter according to embodiment 1 are mounted.
Figure 2B:
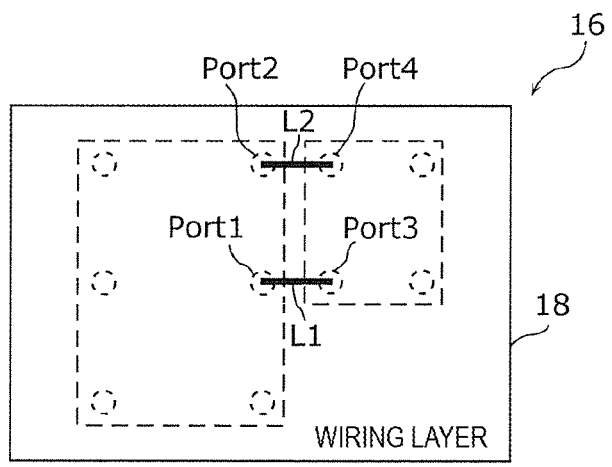
FIG. 2B is a plan view of a wiring layer of the wiring substrate on which the chips that form the filter according to embodiment 1 are mounted.

FIG. 2A is a plan view illustrating a component mounting surface 17 of the wiring substrate 16 on which the chips 12 and 13 constituting the filter 10 according to embodiment 1 are mounted. FIG. 2B is a plan view illustrating a wiring line layer 18 of wiring lines, which connect the chip 12 and the chip 13, to each other, of the wiring substrate 16 on which the chips 12 and 13 constituting the filter 10 according to embodiment 1 are mounted.

As illustrated in FIG. 2A, the chips 12 and 13 are mounted on a substrate. Since the chip 12 and the chip 13 are separate chips, the chip 12 and the chip 13 are connected to each other using wiring lines (for example, pattern wiring lines) as illustrated in FIG. 2B, for example. The outer shapes of the chips 12 and 13 when the substrate is viewed from above and the terminals (bumps) of the chips 12 and 13 are illustrated as broken lines in FIG. 2B. A terminal Port1 of the chip 12 corresponds to a connection node between the parallel arm resonator p1 and the capacitor C1 and a terminal Port2 of the chip 12 corresponds to a connection node between the parallel arm resonator p2 and the capacitor C2. A terminal Port3 of the chip 13 corresponds to a terminal at one end of the switch SW1 (terminal that is not on ground side) and a terminal Port4 of the chip 13 corresponds to a terminal at one end of the switch SW2 (terminal that is not on ground side). Here, the term "wiring lines", for example, refers to elements having inductance components on paths from the parallel arm resonators p1 and p2 formed in the chip 12 to the switches SW1 and SW2 formed in the chip 13, and for example, wiring lines, bumps, and via holes (through holes) in the chips 12 and 13 and wiring lines and via holes in the wiring substrate 16 are included in the meaning of the term "wiring lines". Therefore, along a path from the parallel arm resonator p1 to the switch SW1, the first wiring line includes a wiring line inside the chip 12 or on the chip 12, a bump of the chip 12, a via hole in the wiring substrate 16 connected to the bump of the chip 12, a wiring line inside the wiring substrate 16 or on the wiring substrate 16, a via hole in the wiring substrate 16 that is connected to a bump of the chip 13, the bump of the chip 13, and a wiring line inside the chip 13 or on the chip 13. Similarly, along a path from the parallel arm resonator p2 to the switch SW2, the second wiring line includes a wiring line inside the chip 12 or on the chip 12, a bump of the chip 12, a via hole in the wiring substrate 16 connected to the bump of the chip 12, a wiring line inside the wiring substrate 16 or on the wiring substrate 16, a via hole in the wiring substrate 16 that is connected to a bump of the chip 13, the bump of the chip 13, and a wiring line inside the chip 13 or on the chip 13.

As illustrated in FIG. 2B, the first wiring line, which is the inductor L1, is connected between the terminal Port1 and the terminal Port3 and the second wiring line, which is the inductor L2, is connected between the terminal Port2 and the terminal Port4. The first wiring line and the second wiring line are provided (routed) such that the first inductance value and the second inductance value are substantially equal to each other. In this case, for example, the widths of the first wiring line and the second wiring line are identical, and furthermore, the length of the first wiring line and the length of the second wiring line are substantially equal. In addition, in the case where the first wiring line and the second wiring line are each formed of a single layer, the first inductance value and the second inductance value may be made substantially equal by making the length of the first wiring line larger than that of the second wiring line and making the width of the first wiring line larger than that of the second wiring line. Furthermore, the first wiring line and the second wiring line may be formed of a plurality of layers connected to each other by through holes or via holes, for example. Furthermore, the first wiring line and the second wiring line are not limited to being pattern wiring lines and may instead be wires or the like. In the case where the first wiring line and the second wiring line are wires, the resistance components and the parasitic capacitances are smaller and degradation of the filter characteristics of the filter 10 can be suppressed.

Thus, in the case where the filter 10 is formed of a plurality of chips, wiring lines for connecting the plurality of chips to each other can be utilized as inductors.

There may be cases where it is difficult to provide the first wiring line and the second wiring line such that the first inductance value and the second inductance value are substantially equal to each other because of the arrangement positions of the chips 12 and 13 on the wiring substrate 16 or the arrangement positions of the terminals Port1 to Port4 in the chips 12 and 13. For example, in the case where the terminals Port1 and Port2 of the chip 12 are provided on opposite edges of the chip 12, one out of the first wiring line and the second wiring line will be longer, and therefore it will be necessary to design the other wiring line such that its length matches that of the one long wiring line. Consequently, the attenuation characteristics will be degraded due to magnetic coupling between the one wiring line and the other wiring line and it will also become more difficult to make the filter 10 small in size. Consequently, as illustrated in the figure, the terminals Port 1 and Port 2, which are terminals respectively corresponding to the parallel arm resonators p1 and p2, of the chip 12 in which the parallel arm resonators p1 and p2 are formed are arrayed along one edge of the chip 12, and the terminals Port3 and Port 4, which are terminals respectively corresponding to the switches SW1 and SW2, of the chip 13 in which the switches SW1 and SW2 are formed are arrayed along one edge of the chip 13. As illustrated in the figure, the chips 12 and 13 are arranged on the wiring substrate 16 such that the one edge of the chip 12 along which the terminals Port1 and Port2 are provided and the one edge of the chip 13 along which the terminals Port3 and Port4 are provided face each other.

Consequently, there is no need to make one wiring line out of the first wiring line and the second wiring line longer in order to match the other wiring line and the filter 10 can be made small in size while suppressing degradation of attenuation characteristics.

Furthermore, at least either of the inductor L1 and the inductor L2 may be formed of a chip inductor and mounted on the wiring substrate 16.

[2. Resonator Structure]

Hereafter, the structure of the resonators forming the filter 10 will be described in more detail by focusing on an arbitrary resonator. The other resonators have substantially the same structure as the arbitrary resonator, and therefore detailed description thereof is omitted.

FIGS. 3A and 3B are examples of a diagram that schematically illustrates the structure of a resonator in this embodiment, where FIG. 3A is a plan view and FIG. 3B is a sectional view. The resonator illustrated in FIGS. 3A and 3B are for explaining the typical structure of the resonators constituting the filter 10. Therefore, the number, the length, and so forth of the electrode fingers constituting the IDT electrode of each resonator of the filter 10 are not limited to the number, the length, and so forth of the electrode fingers of the IDT electrode illustrated in the figure. In the figure, illustration of the reflectors of the resonator is omitted.

As illustrated in FIGS. 3A and 3B, the resonator includes an IDT electrode 101, a piezoelectric substrate 102 on which the IDT electrode 101 is formed, and a protective layer 103 that covers the IDT electrode 101. Hereafter, these constituent elements will be described in detail.

As illustrated in FIG. 3A, a pair of interdigital electrodes 101a and 101b, which constitute the IDT electrode 101 and face each other, are formed on the piezoelectric substrate 102. The interdigital electrode 101a is formed of a plurality of electrode fingers 110a, which are parallel to each other, and a busbar electrode 111a that connects the plurality of electrode fingers 110a to each other. Furthermore, the interdigital electrode 101b is formed of a plurality of electrode fingers 110b, which are parallel to each other, and a busbar electrode 111b that connects the plurality of electrode fingers 110b to each other. The plurality of electrode fingers 110a and 110b are formed so as to extend in a direction that is perpendicular to a propagation direction.

The interdigital electrodes 101a and 101b may also be individually referred to as IDT electrodes. However, hereafter, for convenience, description will be given while assuming that the one IDT electrode 101 is formed of the pair of interdigital electrodes 101a and 101b.

In addition, as illustrated in FIG. 3B, the IDT electrode 101, which is formed of the plurality of electrode fingers 110a and 110b and the busbar electrodes 111a and 111b, has a multilayer structure consisting of an adhesive layer 101g and a main electrode layer 101h.

The adhesive layer 101g is a layer for improving adhesion between the piezoelectric substrate 102 and the main electrode layer 101h, and Ti is used as the material thereof, for example. The film thickness of the adhesive layer 101g is 12 nm, for example.

For example, Al containing 1% Cu is used as the material of the main electrode layer 101h. The film thickness of the main electrode layer 101h is 162 nm, for example.

The piezoelectric substrate 102 is a substrate on which the IDT electrode 101 is formed and is for example composed of a $LiTaO_3$ piezoelectric single crystal, a $LiNbO_3$ piezoelectric single crystal, a $KNbO_3$ piezoelectric single crystal, quartz, or a piezoelectric ceramic.

The protective layer 103 is formed so as to cover the interdigital electrodes 101a and 101b. The purpose of the protective layer 103 is to protect the main electrode layer 101h from the outside environment, adjust the frequency-temperature characteristic, increase moisture resistance, and so forth, and for example is a film having silicon dioxide as a main component.

The structure of each resonator of the filter 10 is not limited to the structure illustrated in FIGS. 3A and 3B. For example, the IDT electrode 101 may have a multilayer structure consisting of metal films or may be composed a single metal film layer. In addition, the materials forming the adhesive layer 101g, the main electrode layer 101h, and the protective layer 103 are not limited to the above-described materials. Furthermore, for example, the IDT electrode 101 may be formed of a metal such as Ti, Al, Cu, Pt, Au, Ag, or Pd or an alloy of such a metal, and may be formed of a plurality of multilayer bodies composed of such metals or alloys. In addition, the protective layer 103 does not have to be formed.

In the thus-configured resonator (acoustic wave resonator), the wavelength of an excited acoustic wave is determined by the design parameters and so forth of the IDT electrode 101. In other words, the resonant frequency and the anti-resonant frequency of the resonator are determined by the design parameters and so forth of the IDT electrode 101. Hereafter, the design parameters of the IDT electrode 101, i.e., the design parameters of the interdigital electrode 101a and the interdigital electrode 101b will be described.

The wavelength of an acoustic wave is determined by a repeating period λ of the plurality of electrode fingers 110a or 110b constituting the interdigital electrode 101a or 101b illustrated in FIGS. 3A and 3B. Furthermore, the electrode pitch (electrode period) is ½ the repeating period λ, and is defined by (W+S), where W is the line width of the electrode fingers 110a and 110b constituting the interdigital electrodes and 101a and 101b and S is the width of a space between adjacent electrode fingers 110a and 110b. In addition, as illustrated in FIG. 3A, a cross width L of the IDT electrode 101 is an electrode finger width over which the electrode fingers 110a of the interdigital electrode 101a and the electrode fingers 110b of the interdigital electrode 101b overlap when viewed in the propagation direction of an acoustic wave. In addition, an electrode duty (duty ratio) is a line width occupation ratio of the plurality of electrode fingers 110a and 110b and is defined by the ratio of the line width of the plurality of electrode fingers 110a and 110b with respect to the sum of the line width of the plurality of electrode fingers 110a and 110b and the space width, that is, W/(W+S). Furthermore, the term "number of pairs" refers to the number of electrode fingers 110a and electrode fingers 110b of the interdigital electrodes 101a and 101b that form pairs and is roughly half the total number of electrode fingers 110a and electrode fingers 110b. For example, M=2N+1 is satisfied, where N is the number of pairs and M is the total number of electrode fingers 110a and electrode fingers 110b. In other words, the regions interposed between the leading end part of one electrode finger of one out of the interdigital electrodes 101a and 101b and the other busbar electrode that faces that leading end part correspond to 0.5 of a pair. In addition, the film thickness of the IDT electrode 101 is a thickness h of the plurality of electrode fingers 110a and 110b.

Each capacitor of the filter 10 is for example formed of interdigital electrodes having a plurality of electrode fingers in the acoustic wave propagation direction similarly to the resonators. In addition, for example, each capacitor may be formed of three-dimensional wiring lines in which two stacked wiring lines function as facing electrodes and an insulating layer or dielectric layer is provided between the facing electrodes.

[3. Filter Characteristics]

Next, filter characteristics of the filter 10 according to this embodiment will be described.

Figure 4:
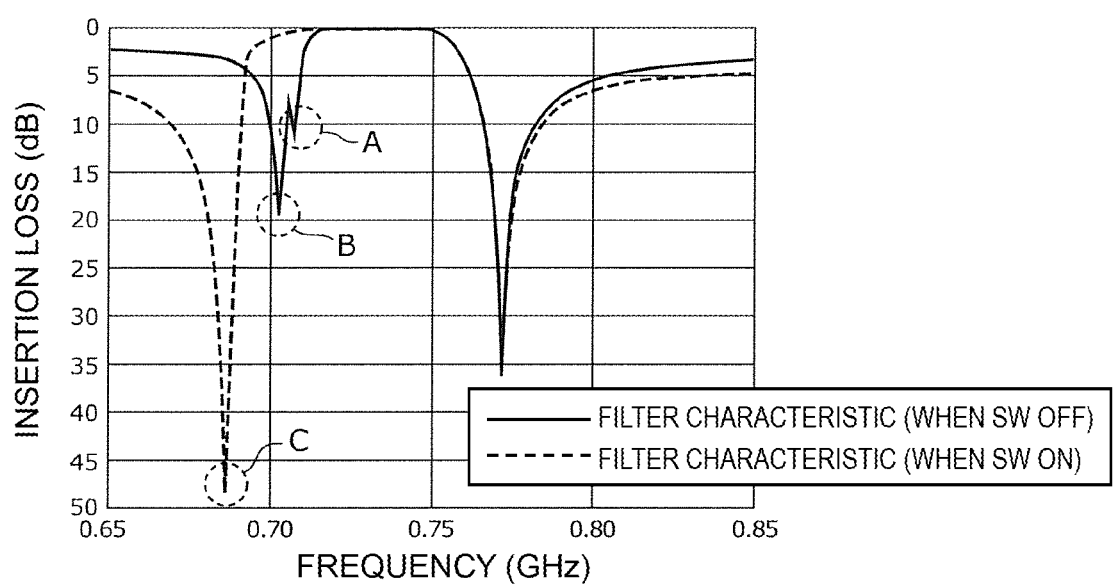
FIG. 4 is a graph illustrating characteristics of the filter according to embodiment 1.

FIG. 4 is a graph illustrating characteristics of the filter 10 according to embodiment 1. Specifically, the figure is a graph illustrating the filter characteristics of the filter 10 when the switches SW1 and SW2 are in a conductive state and a non-conductive state. When the switch SW1 is in a non-conductive state, the impedance characteristic of the first parallel arm resonance circuit is a characteristic in which there is an effect from the capacitor C1. In other words, in this state, the combined characteristic of the parallel arm resonator p1 and the capacitor C1 is the impedance characteristic of the first parallel arm resonance circuit. In addition, when the switch SW2 is in a non-conductive state, the impedance characteristic of the second parallel arm resonance circuit is a characteristic in which there is an effect from the capacitor C2. In other words, in this state, the combined characteristic of the parallel arm resonator p2 and the capacitor C2 is the impedance characteristic of the second parallel arm resonance circuit.

In the filter 10, the relationship fp1≈fp2 is satisfied where fp1 and fp2 are the resonant frequencies of the parallel arm resonators p1 and p2, respectively. In addition, an attenuation pole corresponding to the resonant frequency of the first parallel arm resonance circuit when the switches SW1 and SW2 are in a non-conductive state (referred to as first resonant frequency) is either one out of an attenuation pole indicated in part A in FIG. 4 (referred to as attenuation pole A) and an attenuation pole indicated in part B in FIG. 4 (referred to as attenuation pole B) and an attenuation pole corresponding to the resonant frequency of the second parallel arm resonance circuit (referred to as second resonant frequency) is the other attenuation pole. Therefore, an attenuation band on the low-frequency side of the pass band is formed by the attenuation poles A and B. The frequency difference between the resonant frequency of the parallel arm resonator p1 and the first resonant frequency, that is, the variable frequency amount between when the switch SW1 of the first parallel arm resonance circuit is in a conductive state and a non-conductive state is determined by the capacitor C1. Similarly, the frequency difference between the resonant frequency of the parallel arm resonator p2 and the second resonant frequency, that is, the variable frequency amount between when the switch SW2 of the second parallel arm resonance circuit is in a conductive state and a non-conductive state is determined by the capacitor C2. The variable frequency amount increases as the capacitance value of the capacitor becomes smaller.

Here, when the switches SW1 and SW2 are switched to a conductive state, the impedance characteristic of the first parallel arm resonance circuit is a combined characteristic resulting from the parallel circuit consisting of the capacitor C1 and the inductor L1 being connected in series with the parallel arm resonator p1. Since the impedance of the inductor L1 is substantially lower than that of the capacitor C1, the characteristic of the series circuit consisting of the parallel arm resonator p1 and the inductor L1 is dominant in the characteristic of the first parallel arm resonance circuit. In other words, in this state, the impedance characteristic of the first parallel arm resonance circuit is substantially the combined characteristic of the parallel arm resonator p1 and the inductor L1, and one attenuation pole out of the attenuation pole A and the attenuation pole B (in this case, attenuation pole B) is shifted toward the low-frequency side. In addition, when the switches SW1 and SW2 are switched to a conductive state, the impedance characteristic of the second parallel arm resonance circuit is a combined characteristic resulting from the parallel circuit consisting of the capacitor C2 and the inductor L2 being connected in series with the parallel arm resonator p2. Since the impedance of the inductor L2 is substantially lower than that of the capacitor C2, the characteristic of the series circuit consisting of the parallel arm resonator p2 and the inductor L2 is dominant in the characteristic of the second parallel arm resonance circuit. In other words, in this state, the impedance characteristic of the second parallel arm resonance circuit is substantially the combined characteristic of the parallel arm resonator p2 and the inductor L2, and the other attenuation pole (in this case, attenuation pole A) is shifted toward the low-frequency side.

When the switches SW1 and SW2 are in a non-conductive state, as the bandpass characteristic of the filter 10, a second bandpass characteristic is obtained in which the first resonant frequency is the resonant frequency of the combined characteristic of the parallel arm resonator p1 and the capacitor C1 and the second resonant frequency is the resonant frequency of the combined characteristic of the parallel arm resonator p2 and the capacitor C2. When the switches SW1 and SW2 are in a conductive state, as the bandpass characteristic of the filter 10, a first bandpass characteristic is obtained in which the first resonant frequency is substantially the resonant frequency of the combined characteristic of the parallel arm resonator p1 and the inductor L1 and the second resonant frequency is substantially the resonant frequency of the combined characteristic of the parallel arm resonator p2 and the inductor L2.

Here, as a result of the first inductance value of the inductor L1 and the second inductance value of the inductor L2 being made substantially equal to each other, the first resonant frequency and the second resonant frequency become substantially equal frequencies and the attenuation poles A and B are shifted to an attenuation pole C when the switches SW1 and SW2 are switched from a non-conductive state to a conductive state. In other words, the attenuation amount of the attenuation band is increased due to the two attenuation poles overlapping each other, and thus the attenuation amount of the attenuation band can be increased when the pass band is switched.

Figure 5:
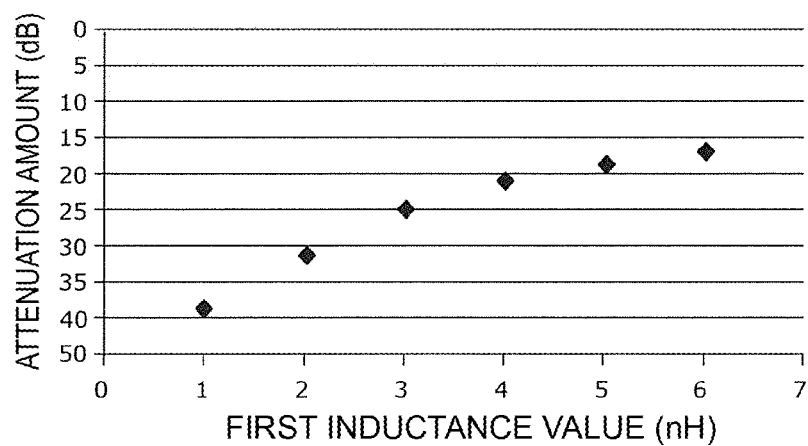
FIG. 5 is a graph illustrating an example of changes in the attenuation amount of an attenuation band when the inductance value of a second inductor is 1 nH and the inductance value of a first inductor is changed.

FIG. 5 is a graph illustrating an example of changes in the attenuation amount of a 685-687 MHz attenuation band that occur when the second inductance value of the inductor L2 is 1 nH and the first inductance value of the inductor L1 is changed. As illustrated in FIG. 5, it is clear that the attenuation amount of the attenuation band increases as the difference between the first inductance value and the second inductance value becomes smaller. For example, in the case where the first inductance value and the second inductance value are the same with a value of 1 nH, an attenuation amount of around 40 dB can be realized.

Figure 6:
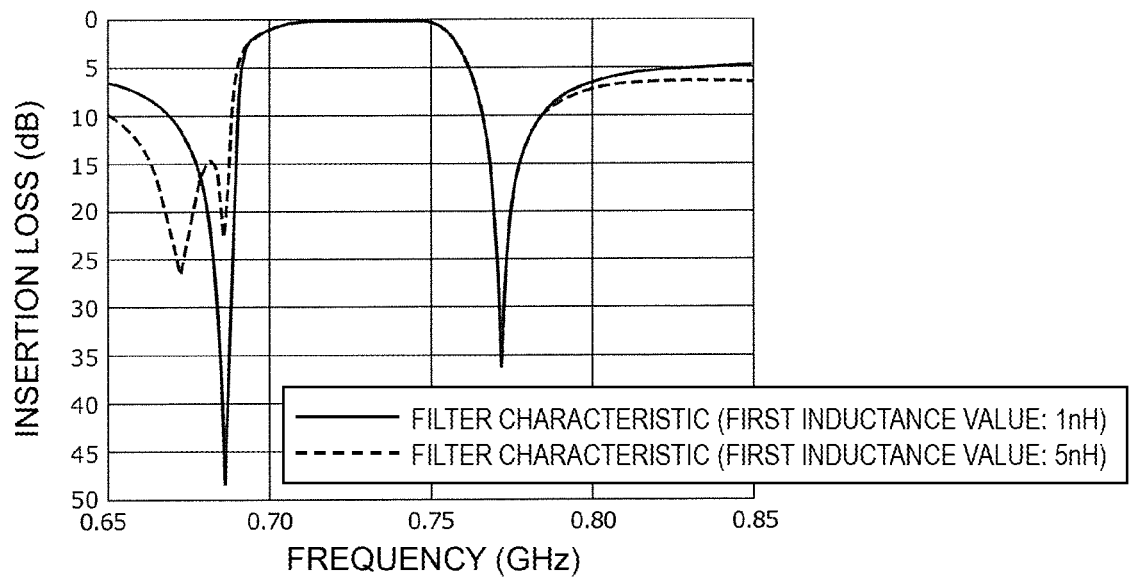
FIG. 6 is a graph illustrating filter characteristics of the filter of embodiment 1 when the inductance value of the second inductor is 1 nH and the inductance value of the first inductor of the filter is changed.

FIG. 6 is a graph illustrating filter characteristics of the filter 10 when the second inductance value of the inductor L2 is 1 nH and the first inductance value of the inductor L1 is changed. FIG. 6 illustrates the filter characteristics when the switches SW1 and SW2 are in a conductive state. The filter characteristic when the switches SW1 and SW2 are in a non-conductive state is the same as the filter characteristic represented by the solid line in FIG. 4 and is therefore omitted. In FIG. 6, a bandpass characteristic obtained when the second inductance value is 1 nH and the first inductance value is 1 nH is represented by a solid line and a bandpass characteristic obtained when the second inductance value is 1 nH and the first inductance value is 5 nH is represented by a broken line.

As illustrated by the solid line in FIG. 6, it is clear that the band width of the attenuation band on the low-frequency side of the pass band is small but a large attenuation amount is obtained when the second inductance value is 1 nH and the first inductance value is 1 nH. On the other hand, as illustrated by the broken line in FIG. 6, it is clear that the band width of the attenuation band on the low-frequency side of the pass band is large but the attenuation amount is small when the second inductance value is 1 nH and the first inductance value is 5 nH.

[4. Effects Etc.]

As described above, in the filter 10 (acoustic wave filter device) according to embodiment 1, for example, in the case where the resonant frequency of the parallel arm resonator p1 and the resonant frequency of the parallel arm resonator p2 are substantially equal frequencies, the first resonant frequency and the second resonant frequency are spaced apart from each other and the band width of the attenuation band of the on the low-frequency side of the pass band in the second bandpass characteristic can be made large when the capacitance values of the capacitor C1 and the capacitor C2 are different from each other, and the first resonant frequency and the second resonant frequency are substantially equal frequencies and the attenuation amount of the attenuation band can be made large, when the capacitance values of the capacitors C1 and C2 are substantially equal.

Here, in the case where the switch SW1 and the switch SW2 are switched from a non-conductive state to a conductive state, the first resonant frequency is no longer affected by the capacitor C1 and is shifted toward the low-frequency side and the second resonant frequency is no longer affected by the capacitor C2 and is shifted toward the low-frequency side. At this time, although the resonant frequency of the parallel arm resonator p1 and the resonant frequency of the parallel arm resonator p2 are substantially equal frequencies, in the case where the first inductance value of the inductor L1 and the second inductance value of the inductor L2 are different from each other, the first resonant frequency and the second resonant frequency are not substantially equal. In other words, the first resonant frequency and the second resonant frequency are affected by the inductor L1 and the inductor L2, which have different inductance values, and become frequencies that are spaced apart from each other, and compared with the case where the first resonant frequency and the second resonant frequency are substantially equal to each other, the attenuation amount is reduced. On the other hand, in the case where the first inductance value and the second inductance value are substantially equal, the first resonant frequency and the second resonant frequency are substantially equal frequencies. Therefore, according to this embodiment, the attenuation amount of the attenuation band can be increased when the frequency of the pass band and the frequency of the attenuation band are switched to lower frequencies.

Furthermore, in the filter 10 according to embodiment 1, the inductor L1 is the first wiring line on a path that connects the parallel arm resonator p1 and ground to each other via the switch SW1 and the inductor L2 is the second wiring line on a path that connects the parallel arm resonator p2 and ground to each other via the switch SW2. For example, in the case where the parallel arm resonators p1 and p2 and the switches SW1 and SW2 are mounted on a substrate as different components, the first wiring line connecting the parallel arm resonator p1 and the switch SW1 to each other and the second wiring line connecting the parallel arm resonator p2 and the switch SW2 to each other are provided on or inside the substrate. In other words, the first wiring line and the second wiring line connected between the components can be used as the inductors L1 and L2, and therefore the inductors L1 and L2 can be easily implemented.

Furthermore, in the filter 10 according to embodiment 1, the first inductance value and the second inductance value can be easily made substantially equal to each other by appropriately designing the lengths, widths, or shapes of the first wiring line and the second wiring line.

Modification of Embodiment 1

In the above-described embodiment, the first wiring line is a wiring line that is connected between a connection node between the parallel arm resonator p1 and the capacitor C1, and the switch SW1, and the second wiring line is a wiring line that is connected between the connection node between the parallel arm resonator p2 and the capacitor C2, and the switch SW2. However, the first wiring line may instead be a wiring line that is connected between the parallel arm resonator p1 and a connection node between the switch SW1 and the capacitor C1, and the second wiring line may instead be a wiring line that is connected between the parallel arm resonator p2 and a connection node between the switch SW2 and the capacitor C2.

Figure 7:
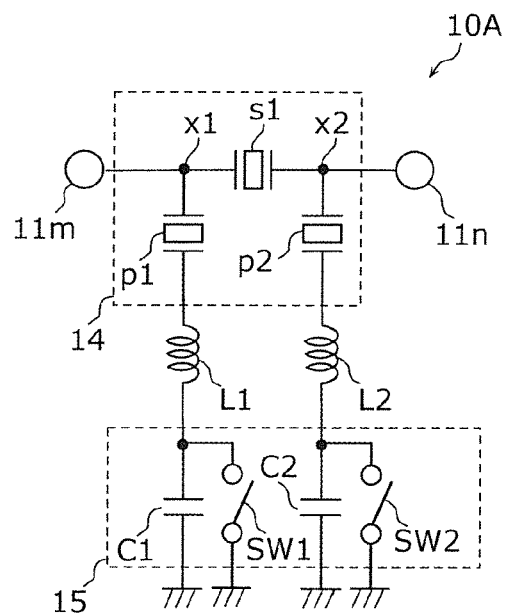
FIG. 7 is a circuit configuration diagram of a filter according to a modification of embodiment 1.

FIG. 7 is a circuit configuration diagram of a filter 10A according to a modification of embodiment 1.

In the above-described embodiment, the series arm resonator s1, the parallel arm resonators p1 and p2, and the capacitors C1 and C2 are formed in the same chip 12, and the switches SW1 and SW2 are formed in the same chip 13. However, as illustrated in FIG. 7, the series arm resonator s1 and the parallel arm resonators p1 and p2 may be formed in an identical chip 14, and the switches SW1 and SW2 and the capacitors C1 and C2 may be formed in an identical chip 15. In this case, the first wiring line, which is the inductor L1, is a wiring line that is connected between the parallel arm resonator p1 and the connection node between the switch SW1 and the capacitor C1, and the second wiring line, which is the inductor L2, is a wiring line that is connected between the parallel arm resonator p2 and the connection node between the switch SW2 and the capacitor C2.

In this case, when the switches SW1 and SW2 are in a non-conductive state, a second bandpass characteristic is obtained in which the first resonant frequency is the resonant frequency of the combined characteristic of a series circuit consisting of the parallel arm resonator p1, the capacitor C1 and the inductor L1 and the second resonant frequency is the resonant frequency of the combined characteristic of a series circuit consisting of the parallel arm resonator p2, the capacitor C2, and the inductor L2. On the other hand, when the switches SW1 and SW2 are in a conductive state, a first bandpass characteristic is obtained in which the first resonant frequency is substantially the resonant frequency of the combined characteristic of the parallel arm resonator p1 and the inductor L1 and the second resonant frequency is substantially the resonant frequency of the combined characteristic of the parallel arm resonator p1 and the inductor L2.

In this case as well, the first inductance value and the second inductance value are made substantially equal to each other by appropriately adjusting the length, width, or shape of the first wiring line and the second wiring line.

Embodiment 2

The filters (acoustic wave filter devices) according to the above-described embodiment and modification are tunable filters in which the pass band can be changed. As filters according to embodiment 2, application examples of such a tunable filter will be described using application examples 1 to 4.

Application Example 1

Figure 8:
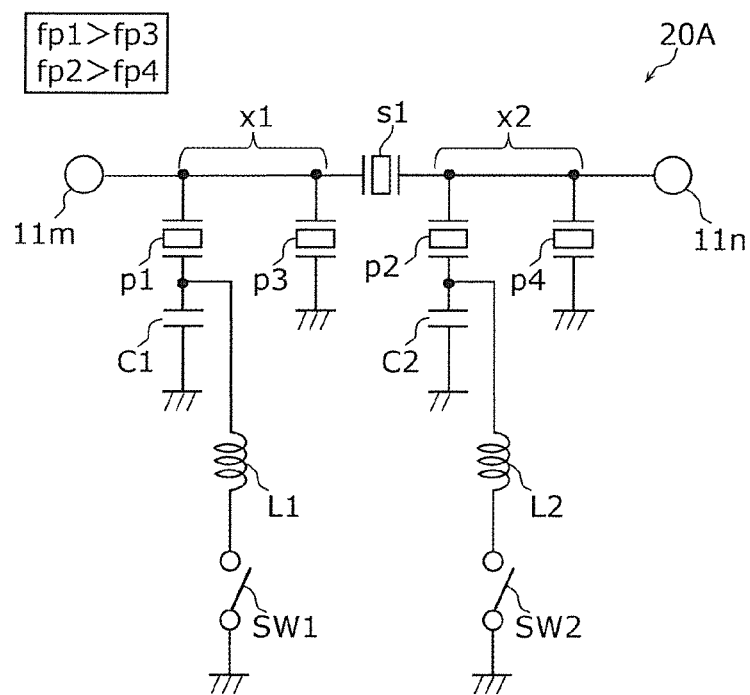
FIG. 8 is a circuit configuration diagram of a filter according to application example 1 of embodiment 2.

FIG. 8 is a circuit configuration diagram of a filter 20A according to application example 1 of embodiment 2.

Compared with the filter 10 illustrated in FIG. 1, the filter 20A illustrated in the figure further includes a third parallel arm resonance circuit connected in parallel with the first parallel arm resonance circuit between the node x1 and ground and a fourth parallel arm resonance circuit connected in parallel with the second parallel arm resonance circuit between the node x2 and ground. The third parallel arm resonance circuit includes a parallel arm resonator p3 (third parallel arm resonator) that is connected to the node x1, and the fourth parallel arm resonance circuit includes a fourth parallel arm resonator that is connected to the node x2. In addition, the resonant frequency of the parallel arm resonator p1 (referred to as fp1) is different from the resonant frequency of the parallel arm resonator p3 (referred to as fp3), and the resonant frequency of the parallel arm resonator p2 (referred to as fp2) is different from the resonant frequency of the parallel arm resonator p4 (referred to as fp4). In this application example, fp1 is higher than fp3 and fp2 is higher than fp4.

Here, a filter 200A formed of the series arm resonator s1, the second parallel arm resonance circuit, and the fourth parallel arm resonance circuit of the filter 20A will be described.

Figure 9A:
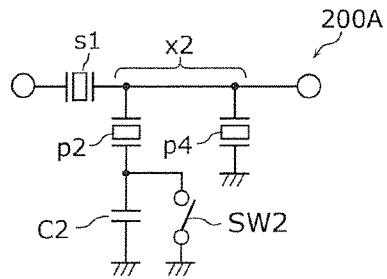
FIG. 9A is a circuit configuration diagram of a filter formed of a series arm resonator, a second parallel arm resonance circuit, and a fourth parallel arm resonance circuit in application example 1 of embodiment 2.

FIG. 9A is a circuit configuration diagram of a filter 200A formed of the series arm resonator s1, the second parallel arm resonance circuit, and the fourth parallel arm resonance circuit of application example 1 of embodiment 2. Illustration of the inductor L2 is omitted from FIG. 9A.

In the filter 200A illustrated in the figure, the frequency at which the impedance is minimum and the frequency at which the impedance is maximum are both shifted toward the low-frequency side or the high-frequency side in accordance with whether the switch SW2 is in a conductive state or a non-conductive state.

Figure 9B:
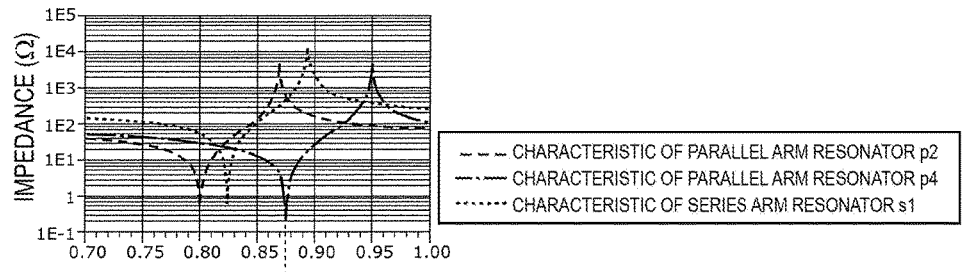
FIGS. 9BA-9BC depict graphs illustrating the characteristics of the filter formed of the series arm resonator, the second parallel arm resonance circuit, and the fourth parallel arm resonance circuit in application example 1 of embodiment 2.
Figure 9B:
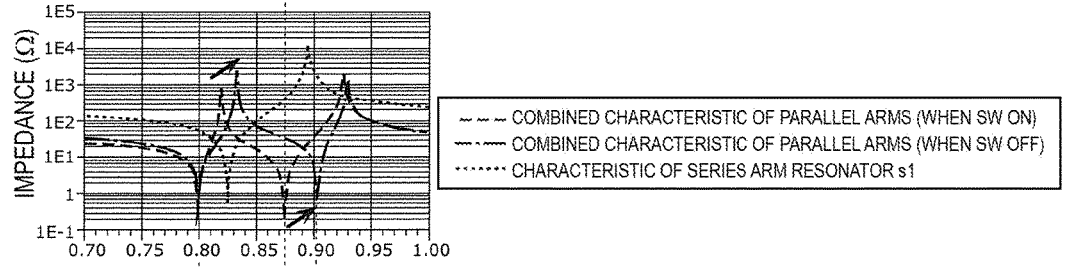
Figure 9B:
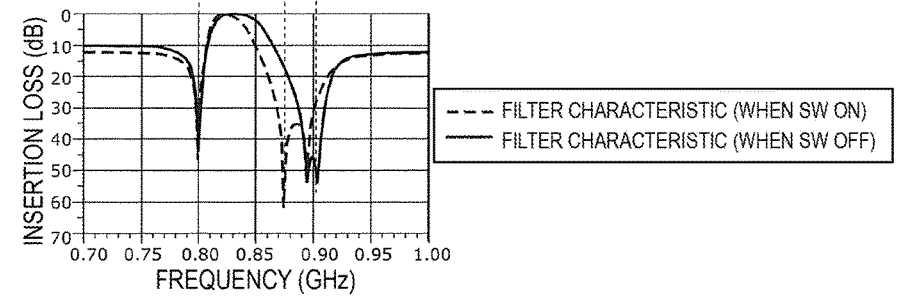

FIGS. 9BA-9BC are graphs illustrating characteristics of the filter 200A of application example 1 of embodiment 2. Specifically, FIG. 9BA is a graph illustrating the impedance characteristics of the resonators as standalone units (parallel arm resonators p2 and p4 and the series arm resonator s1). FIG. 9BB is a graph illustrating in a comparative manner a combined impedance characteristic (combined characteristic) of the parallel arm resonance circuits (circuits formed of parallel arm resonators p2 and p4 and capacitor C2 and switch SW2 in this application example) when the switch SW2 is in a conductive state and a non-conductive state. The impedance characteristic of the series arm resonator s1 is also illustrated in the figure. FIG. 9BC is a graph illustrating in a comparative manner filter characteristics for when the switch SW2 is in a conductive state and a non-conductive state.

When the switch SW2 is in a conductive state, the filter 200A has a first bandpass characteristic in which the pass band is defined by the low-frequency-side anti-resonant frequency among the two anti-resonant frequencies of the parallel arm circuits and the resonant frequency of the series arm resonator s1, a pole (attenuation pole) on the low-frequency side of the pass band is defined by the resonant frequency of the parallel arm resonator p2, and a pole (attenuation pole) on the high-frequency side of the pass band is defined by the resonant frequency of the parallel arm resonator p4 and the anti-resonant frequency of the series arm resonator s1.

On the other hand, when the switch SW2 is in a non-conductive state, the impedance characteristic of the parallel arm circuits is a characteristic in which there is an effect from the capacitor C2. That is, in this state, the combined characteristic of the two parallel arm resonators (parallel arm resonators p2 and p4) and the capacitor C2 is the impedance characteristic of the parallel arm circuits.

In this application example, the capacitor C2 is added to just the parallel arm resonator p2 when the switch SW2 is in a non-conductive state. Therefore, as indicated by the black arrows in FIG. 9BB, when the switch SW2 is switched from the conductive state to the non-conductive state, in the impedance characteristic of the parallel arm circuits (combined characteristic of parallel arms in figure), the high-frequency side resonant frequency among the two resonant frequencies and the low-frequency side anti-resonant frequency among the two anti-resonant frequencies are both shifted toward the high-frequency side.

Here, the low-frequency side anti-resonant frequency and the high-frequency side resonant frequency of the parallel arm circuits determine the attenuation slope on the high-frequency side of the pass band of the filter 200A. Therefore, as illustrated in FIG. 9BC, the bandpass characteristic of the filter 200A is switched from the first bandpass characteristic to a second bandpass characteristic that is shifted toward the high-frequency side while maintaining the steepness of the attenuation slope on the high-frequency side of the pass band by switching the switch SW2 from the conductive state to the non-conductive state. In other words, as well as being able to switch the frequency of the attenuation pole on the high-frequency side of the pass band in accordance with switching of the switch SW2 between a conductive state and a non-conductive state, the filter 200A can suppress an increase in insertion loss at the high-frequency end of the pass band.

Similarly to the filter 200A, a filter formed of the series arm resonator s1, the first parallel arm resonance circuit, and the third parallel arm resonance circuit of the filter 20A can also switch the frequency of the attenuation pole on the high-frequency side of the pass band in accordance with switching of the switches SW1 and SW2 between a conductive state and a non-conductive state and can suppress an increase in insertion loss at the high-frequency end of the pass band.

Also, in the case of such a filter 20A having a multiple-stage configuration including the filter 200A (here two-stage configuration), the attenuation amount of the attenuation band can be increased when the pass band is switched, similarly to as in embodiment 1, by making the first inductance value and the second inductance value substantially equal to each other.

Application Example 2

Figure 10:
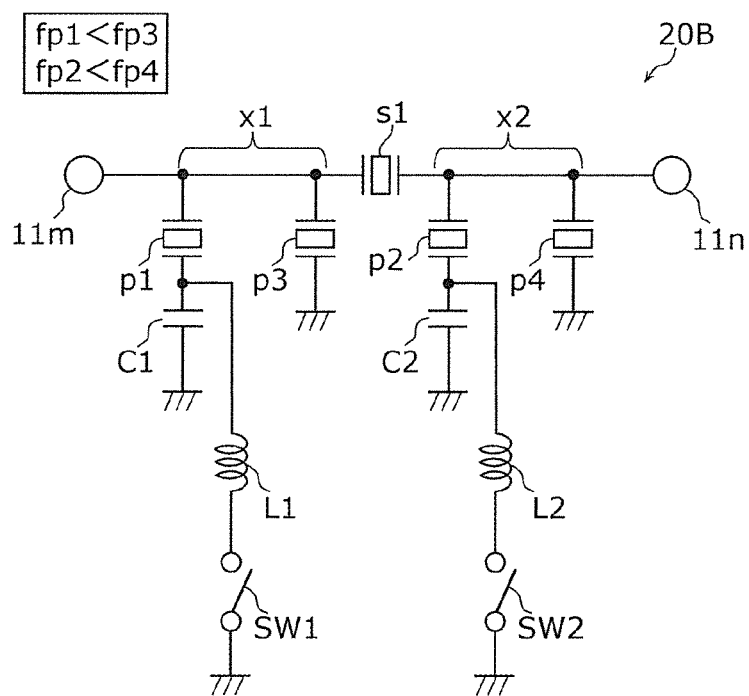
FIG. 10 is a circuit configuration diagram of a filter according to application example 2 of embodiment 2.

FIG. 10 is a circuit configuration diagram of a filter 20B according to application example 2 of embodiment 2.

The filter 20B illustrated in the figure differs from the filter 20A illustrated in FIG. 8 in that fp1 is lower than fp3 and fp2 is lower than fp4.

Here, a filter 200B formed of the series arm resonator s1, the second parallel arm circuit, and the fourth parallel arm circuit of the filter 20B will be described.

Figure 11A:
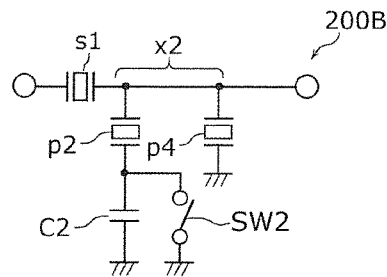
FIG. 11A is a circuit configuration diagram of a filter formed of a series arm resonator, a second parallel arm resonance circuit, and a fourth parallel arm resonance circuit in application example 2 of embodiment 2.

FIG. 11A is a circuit configuration diagram of the filter 200B according to application example 2 of embodiment 2.

Illustration of the inductor L2 is omitted from FIG. 11A.

The circuit configuration of the filter 200B is the same as that of the filter 200A, and therefore description thereof is omitted (however, fp2 is lower than fp4).

Figure 11B:
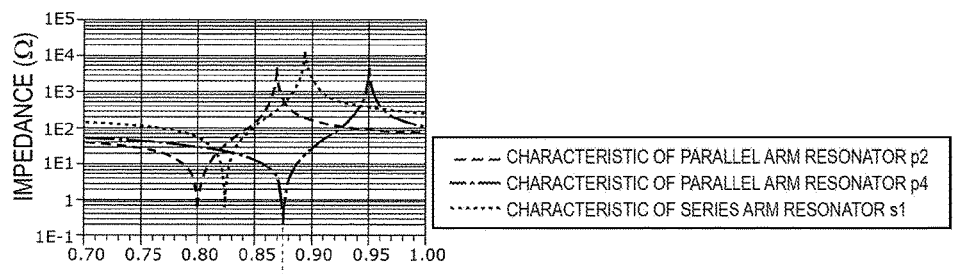
FIGS. 11BA-11BC depict graphs illustrating the characteristics of the filter formed of the series arm resonator, the second parallel arm resonance circuit, and the fourth parallel arm resonance circuit in application example 2 of embodiment 2.
Figure 11B:
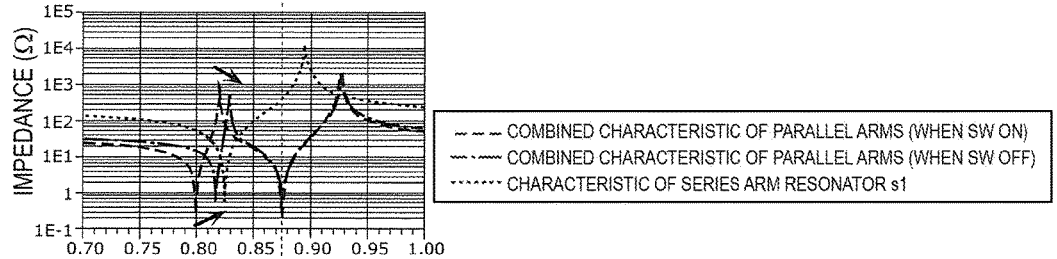
Figure 11B:
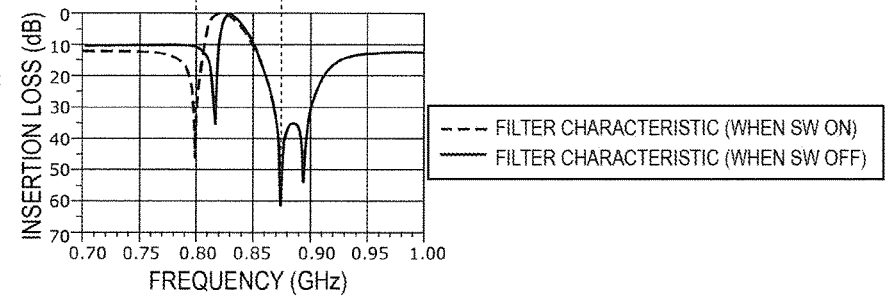

FIGS. 11BA-11BC are graphs illustrating characteristics of the filter 200B of application example 2 of embodiment 2. Specifically, FIGS. 11BA and 11BB are graphs respectively illustrating the impedance characteristics of the resonators as standalone units and the combined impedance characteristic of the parallel arm circuits, similarly to FIGS. 9BA and 9BB. FIG. 11BC is a graph illustrating in a comparative manner filter characteristics for when the switch SW2 is in a conductive state and a non-conductive state.

In this application example, the capacitor C2 is added to just the parallel arm resonator p2 when the switch SW2 is in a non-conductive state. Therefore, as indicated by the black arrows in FIG. 11BB, when the switch SW2 is switched from the conductive state to the non-conductive state, in the impedance characteristic of the parallel arm circuits (combined characteristic of parallel arms in figure), the low-frequency side resonant frequency among the two resonant frequencies and the low-frequency side anti-resonant frequency among the two anti-resonant frequencies are both shifted toward the high-frequency side.

Here, the low-frequency side anti-resonant frequency and the low-frequency side resonant frequency of the parallel arm circuits determine the attenuation slope on the low-frequency side of the pass band of the filter 200B. Therefore, as illustrated in FIG. 11BC, the bandpass characteristic of the filter 200B is switched from the first bandpass characteristic to a second bandpass characteristic that is shifted toward the high-frequency side while maintaining the steepness of the attenuation slope on the low-frequency side of the pass band by switching the switch SW2 from the conductive state to the non-conductive state. In other words, as well as being able to switch the frequency of the attenuation pole on the low-frequency side of the pass band in accordance with switching of the switch SW2 between a conductive state and a non-conductive state, the filter 200B can suppress an increase in insertion loss at the low-frequency end of the pass band.

Similarly to the filter 200B, a filter formed of the series arm resonator s1, the first parallel arm resonance circuit, and the third parallel arm resonance circuit of the filter 20B can also switch the frequency of the attenuation pole on the low-frequency side of the pass band in accordance with switching of the switches SW1 and SW2 between a conductive state and a non-conductive state and can suppress an increase in insertion loss at the low-frequency end of the pass band.

Also, in the case of such a filter 20B having a multiple-stage configuration including the filter 200B (here two-stage configuration), the attenuation amount of the attenuation band can be increased when the pass band is switched, similarly to as in embodiment 1, by making the first inductance value and the second inductance value substantially equal to each other.

Application Example 3

Figure 12:
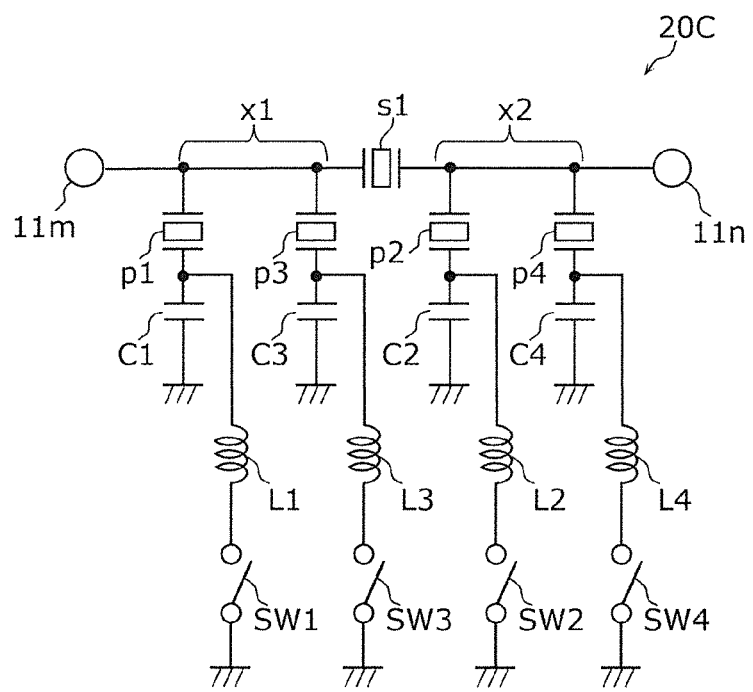
FIG. 12 is a circuit configuration diagram of a filter according to application example 3 of embodiment 2.

FIG. 12 is a circuit configuration diagram of a filter 20C according to application example 3 of embodiment 2.

In the filter 20C, the third parallel arm resonance circuit further includes a pair of elements consisting of a capacitor C3 (third impedance element) and a switch SW3 (third switch), which are connected in parallel with each other, that is connected in series with the parallel arm resonator p3 between the parallel arm resonator p3 and ground, and further includes an inductor L3 (third inductor) that is provided on a path that connects the parallel arm resonator p3 and ground via the switch SW3. In addition, in the filter 20C, the fourth parallel arm resonance circuit further includes a pair of elements consisting of a capacitor C4 (fourth impedance element) and a switch SW4 (fourth switch), which are connected in parallel with each other, that is connected in series with the parallel arm resonator p4 between the parallel arm resonator p4 and ground, and further includes an inductor L4 (fourth inductor) that is provided on a path that connects the parallel arm resonator p4 and ground via the switch SW4. The inductor L3 is for example a wiring line (third wiring line) on a path that connects the parallel arm resonator p3 and ground to each other via the switch SW3. The inductor L4 is for example a wiring line (fourth wiring line) on a path that connects the parallel arm resonator p4 and ground to each other via the switch SW4. In addition, the inductance value of the inductor L3 (referred to as third inductance value) and the inductance value of the inductor L4 (referred to as fourth inductance value) are different from each other. In addition, fp1 is different from fp3 and fp2 is different from fp4. In this application example, fp1 is higher than fp3 and fp2 is higher than fp4, for example.

Here, a filter 200C formed of the series arm resonator s1, the second parallel arm resonance circuit, and the fourth parallel arm resonance circuit of the filter 20C will be described.

Figure 13A:
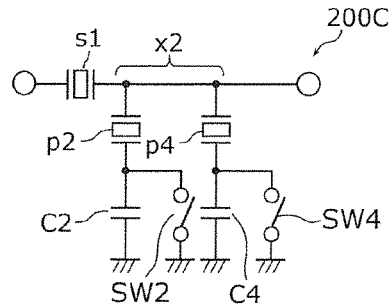
FIG. 13A is a circuit configuration diagram of a filter formed of a series arm resonator, a second parallel arm resonance circuit, and a fourth parallel arm resonance circuit in application example 3 of embodiment 2.

FIG. 13A is a circuit configuration diagram of the filter 200C according to application example 3 of embodiment 2. Illustration of the inductors L2 and L4 is omitted from FIG. 13A. The filter 200C illustrated in the figure shifts the attenuation slopes on both the high-frequency side of the pass band and the low-frequency side of the pass band.

Figure 13B:
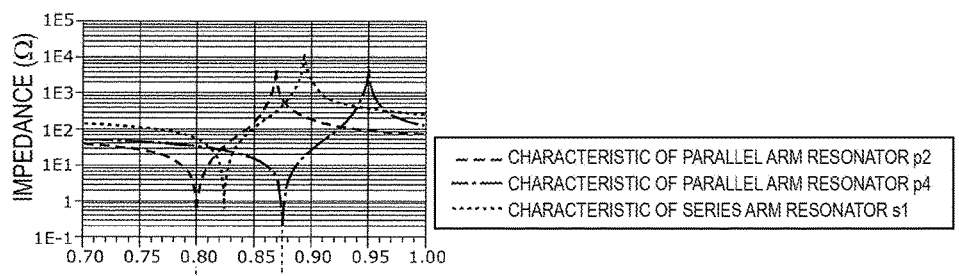
FIG. 13BA-13BC depict graphs illustrating the characteristics of the filter formed of the series arm resonator, the second parallel arm resonance circuit, and the fourth parallel arm resonance circuit in application example 3 of embodiment 2.
Figure 13B:
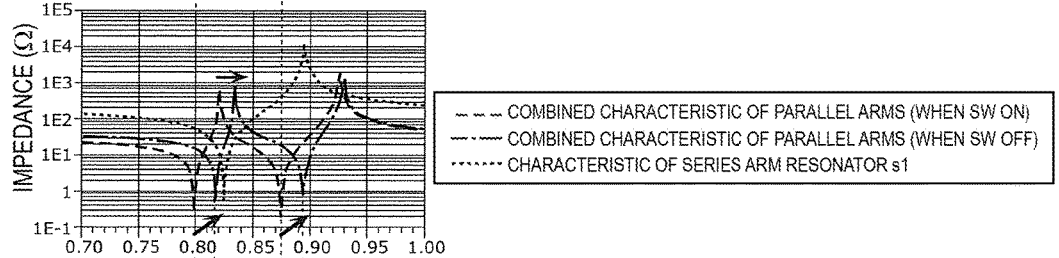
Figure 13B:
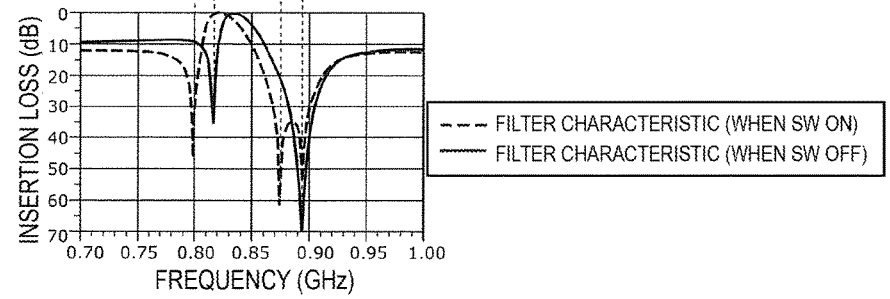

FIGS. 13BA-13BC are graphs illustrating characteristics of the filter 200C of application example 3 of embodiment 2. Specifically, FIGS. 13BA and 13BB are graphs illustrating the impedance characteristics of the resonators as standalone units and the combined impedance characteristic of the parallel arm circuits (circuits formed of parallel arm resonators p2 and p4, capacitors C2 and C4, and switches SW2 and SW4 in this application example), similarly to FIGS. 9BA and 9BB. FIG. 13BC is a graph illustrating in a comparative manner filter characteristics for when the switches SW2 and SW4 are both in a conductive state and a non-conductive state.

In this application example, the capacitor C2 is added to the parallel arm resonator p2 and the capacitor C4 is added to the parallel arm resonator p4 when both the switches SW2 and SW4 are in a non-conductive state. Therefore, as indicated by the black arrows in FIG. 13BB, when the switches SW2 and SW4 are both switched from the conductive state to the non-conductive state, in the impedance characteristic of the parallel arm circuits (combined characteristic of parallel arms in figure), both of the two resonant frequencies and the low-frequency side anti-resonant frequency among the two anti-resonant frequencies are all shifted toward the high-frequency side.

Therefore, as illustrated in FIG. 13BC, the bandpass characteristic of the filter 200C is switched from the first bandpass characteristic to a second bandpass characteristic that is shifted toward the high-frequency side while maintaining the steepness of the attenuation slopes on the high-frequency side of the pass band and the low-frequency side of the pass band by switching both the switches SW2 and SW4 from the conductive state to the non-conductive state. In other words, as well as being able to switch the frequencies of the attenuation poles on the high-frequency side of the pass band and the low-frequency side of the pass band in accordance with switching of the switches SW2 and SW4 between a conductive state and a non-conductive state, the filter 200C can suppress an increase in insertion loss at the high-frequency end of the pass band and the low-frequency end of the pass band. Therefore, for example, the filter 200C can shift the center frequency while maintaining the band width.

In addition, in the filter 200C, the switches SW2 and SW4 do not have to be switched to a conductive state or a non-conductive state together and may instead be individually switched to a conductive state or a non-conductive state. However, in the case where the switches SW2 and SW4 are switched to a conductive state or a non-conductive state together, the number of control lines for controlling the switches SW2 and SW4 can be reduced, and therefore the configuration of the filter 200C is simplified.

On the other hand, when the switches are individually switched to a conductive state or a non-conductive state, the number of pass band variations that can be switched between using the filter 200C can be increased.

Specifically, since fp2 is higher than fp4, the high-frequency end of the pass band can be changed in accordance with switching of the switch SW2, which is serially connected to the parallel arm resonator p2, between a conductive state and a non-conductive state, and the low-frequency end of the pass band can be changed in accordance with switching of the switch SW4, which is serially connected to the parallel arm resonator p4, between a conductive state and a non-conductive state.

Therefore, the low-frequency end and the high-frequency end of the pass band can be both shifted toward the low-frequency side or the high-frequency side by switching the switches SW2 and SW4 to a conductive state or a non-conductive state together. In other words, the center frequency of the pass band can be shifted toward the low-frequency side or the high-frequency side. In addition, both the low-frequency end and the high-frequency end of the pass band can be shifted such that the frequency difference therebetween is increased or decreased by switching either one out of the switches SW2 and SW4 from a conductive state to a non-conductive state and switching the other one out of the switches SW2 and SW4 from a non-conductive state to a conductive state. In other words, the pass band width can be changed while maintaining the center frequency of the pass band substantially constant. In addition, either one out of the low-frequency end and the high-frequency end of the pass band can be left fixed while the other end can be shifted toward the low-frequency side or the high-frequency side by leaving one out of the switches SW2 and SW4 in a conductive state or a non-conductive state while switching the other one out of the switches SW2 and SW4 to a conductive state or a non-conductive state. That is, the low-frequency end or the high-frequency end of the pass band can be made variable.

Thus, the degree of freedom with which the pass band can be changed can be increased as a result of the second parallel arm resonance circuit and the fourth parallel arm resonance circuit having the capacitors C2 and C4 and the switches SW2 and SW4.

Similarly to the filter 200C, a filter formed of the series arm resonator s1, the first parallel arm resonance circuit, and the third parallel arm resonance circuit of the filter 20C can also switch the frequencies of the attenuation poles on high-frequency side of the pass band and the low-frequency side of the pass band in accordance with switching of the switches SW1 to SW4 between a conductive state and a non-conductive state and can suppress an increase in insertion loss at the high-frequency end and the low-frequency end of the pass band. In addition, the degree of freedom with which the pass band can be changed can be increased as a result of the first parallel arm resonance circuit and the third parallel arm resonance circuit having the capacitors C1 and C3 and the switches SW1 and SW3.

Also in the case of such a filter 20C having a multiple stage configuration including the filter 200C (here two-stage configuration), the attenuation amount of an attenuation band can be increased at both the high-frequency side of the pass band and the low-frequency side of the pass band when the pass band is switched by making the first inductance value and the second inductance value substantially equal to each other and making the third inductance value and the fourth inductance value substantially equal to each other.

Application Example 4

Figure 14:
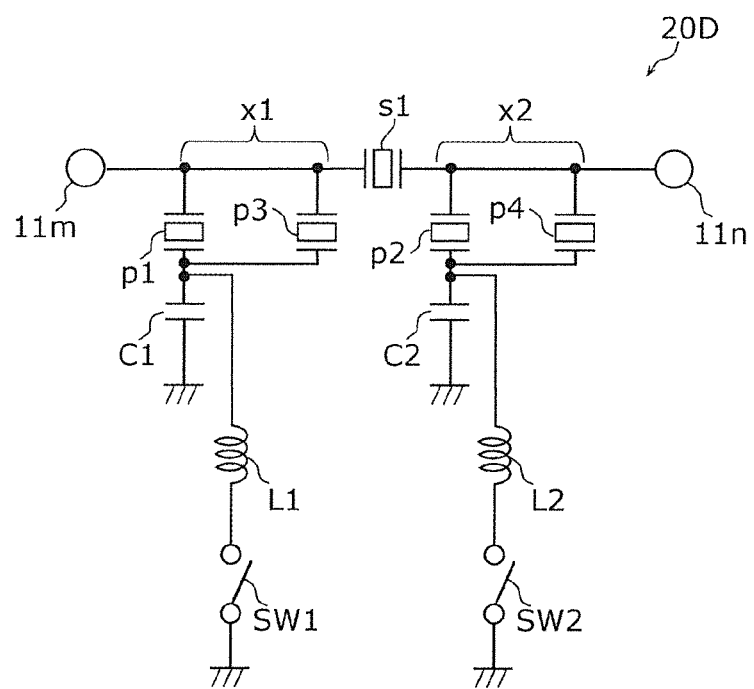
FIG. 14 is a circuit configuration diagram of a filter according to application example 4 of embodiment 2.

FIG. 14 is a circuit configuration diagram of a filter 20D according to application example 4 of embodiment 2.

The filter 20D illustrated in the figure differs from the filter 20A illustrated in FIG. 8 in that a pair of elements consisting of the capacitor C1 and the switch SW1, which are connected in parallel with each other, is serially connected to a circuit consisting of the parallel arm resonator p1 and the parallel arm resonator p3 connected in parallel with each other, and a pair of elements consisting of the capacitor C2 and the switch SW2, which are connected in parallel with each other, is serially connected to a circuit consisting of the parallel arm resonator p2 and the parallel arm resonator p4 connected in parallel with each other. Here, a first parallel arm resonance circuit is formed by the circuit in which the pair of elements consisting of the capacitor C1 and the switch SW1, which are connected in parallel with each other, is serially connected to the circuit consisting of the parallel arm resonator p1 and the parallel arm resonator p3, which are connected in parallel with each other, and a second parallel arm resonance circuit is formed by the circuit in which the pair of elements consisting of the capacitor C2 and the switch SW2, which are connected in parallel with each other, is serially connected to the circuit consisting of the parallel arm resonator p2 and the parallel arm resonator p4, which are connected in parallel with each other.

Here, a filter 200D formed of the series arm resonator s1 and the second parallel arm resonance circuit of the filter 20D will be described.

FIG. 15A is a circuit configuration diagram of the filter 200D according to application example 3 of embodiment 2.

FIGS. 15BA-15BC are graphs illustrating characteristics of the filter 200D of application example 4 of embodiment 2. Specifically, FIGS. 15BA and 15BB are graphs respectively illustrating the impedance characteristics of the resonators as standalone units and the combined impedance characteristic of the parallel arm circuits, similarly to FIGS. 9BA and 9BB. FIG. 15BC is a graph illustrating in a comparative manner filter characteristics for when the switch SW2 is in a conductive state and a non-conductive state.

In this application example, the capacitor C2 is added to the parallel arm resonators p1 and p2 when the switch SW2 is in a non-conductive state. Therefore, as indicated by the black arrows in FIG. 15BB, when the switch SW2 is switched from a conductive state to a non-conductive state, neither of the two anti-resonant frequencies is shifted whereas the two resonant frequencies are both shifted toward the high-frequency side in the impedance characteristic of the parallel arm circuits (combined characteristic of parallel arms in figure).

Therefore, as illustrated in FIG. 15BC, the bandpass characteristic of the filter 200D is switched from the first bandpass characteristic to a second bandpass characteristic in which the attenuation poles on both sides of the pass band are both shifted toward the high-frequency side by switching the switch SW2 from a conductive state to a non-conductive state.

Similarly to the filter 200D, also in a filter formed of the series arm resonator s1 and the first parallel arm resonance circuit of the filter 20D, the first bandpass characteristic is switched to a second bandpass characteristic in which poles (attenuation poles) on both sides of the pass band are shifted toward the high-frequency side.

Also, in the case of such a filter 20D having a multiple-stage configuration including the filter 200D (here two-stage configuration), the attenuation amount of the attenuation band can be increased when the pass band is switched, similarly to as in embodiment 1, by making the first inductance value and the second inductance value substantially equal to each other.

Embodiment 3

In the above-described embodiments and modifications, it is assumed that a filter (acoustic wave filter device) includes one first series arm resonance circuit (series arm resonator s1), a first parallel arm resonance circuit connected between the node x1, which is on the input/output terminal 11m side of the first series arm resonance circuit, and ground, and a second parallel arm resonance circuit connected between the node x2, which is on the input/output terminal 11n side of the first series arm resonance circuit, and ground. However, a filter (acoustic wave filter device) may instead be formed of two or more series arm resonance circuits and three or more parallel arm resonance circuits that are respectively connected to different nodes in the series arm resonance circuits. In embodiment 3, for example, a filter 30 will be described that includes a series arm resonator s1 and a series arm resonator s2, as the two or more series arm resonance circuits, and a first parallel arm resonance circuit, a second parallel arm resonance circuit, and at least one fifth parallel arm resonance circuit (here one fifth parallel arm resonance circuit), as the three or more parallel arm resonance circuits.

Furthermore, a duplexer may be formed in which one terminal of the filter 30 and one terminal of a filter having a different pass band from the pass band of the filter 30 are connected to each other via a phase shifter 60 thus forming a common terminal. Here, a duplexer 50 in which one terminal of the filter 30 and one terminal of a filter 40 having a different pass band from the filter 30 are connected to each other via the phase shifter 60 thus forming a common terminal will be described using FIG. 16.

Figure 16:
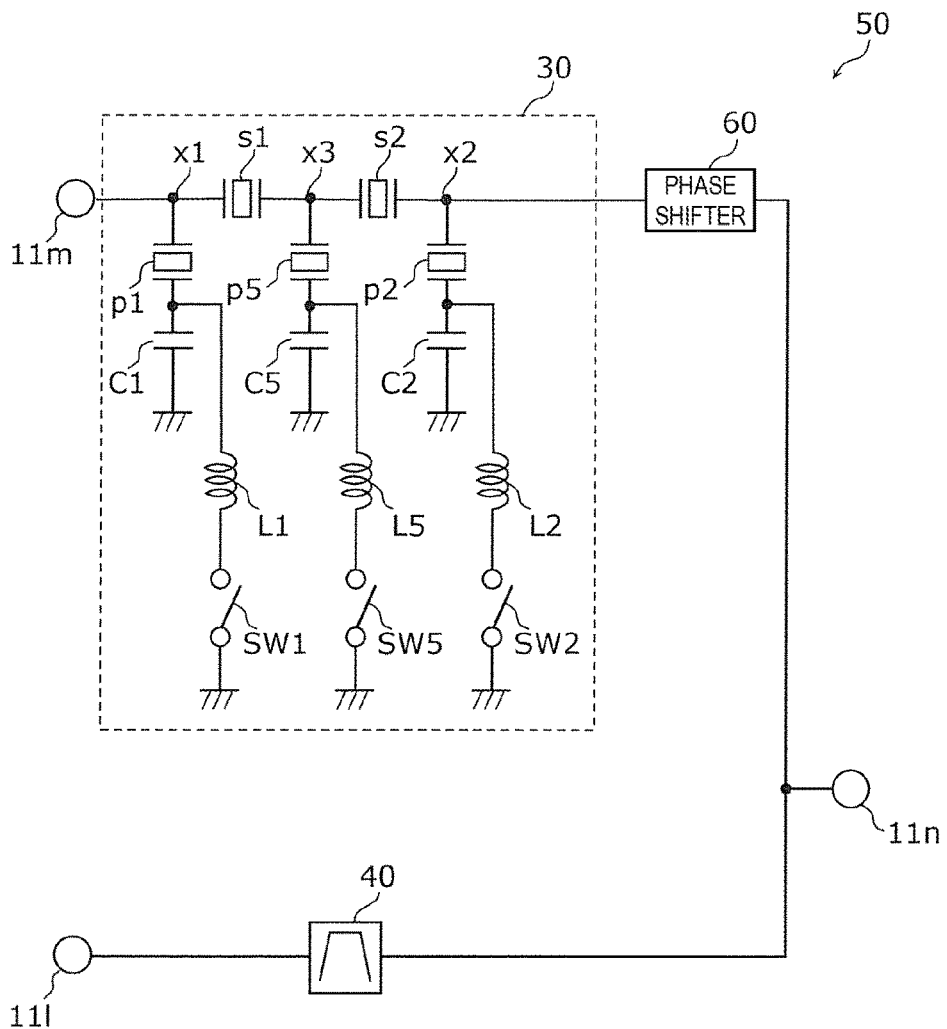
FIG. 16 is a circuit configuration diagram of a multiplexer according to embodiment 3.

FIG. 16 is a circuit configuration diagram of the duplexer 50 according to embodiment 3.

The duplexer 50 illustrated in the figure includes: the filter 30 that, compared with the filter 10 illustrated in FIG. 1, additionally includes the series arm resonator s2, a parallel arm resonator p5, a capacitor C5, an inductor L5, and a switch SW5; the filter 40 in which the frequency of the pass band is different from that of the filter 30; and the phase shifter 60.

In the configuration of the duplexer 50, for example, the filter 30 is a transmission filter and the filter 40 is a reception filter. The input/output terminal 11m is a so-called transmission terminal to which a radio-frequency transmission signal is input. The input/output terminal 11n is a common terminal used by both the transmission filter and the reception filter and is a so-called antenna common terminal from which a radio-frequency transmission signal is output and to which a radio-frequency reception signal is input. Furthermore, an input/output terminal 11l, which is the other terminal of the filter 40, is an output terminal from which a radio-frequency reception signal is output.

Here, the duplexer 50 is a duplexer in which one terminal of the transmission filter, which is the filter 30, and one terminal of the reception filter, which is the filter 40, are connected to each other via the phase shifter 60, but these terminals may instead be connected to each other via a switch or a circulator or may instead be directly connected to each other. In the case where these terminals are connected to each other via a switch, the pass bands of the filter 30 and the filter 40 may overlap.

Here, the constituent elements that the filter 30 additionally includes compared with the filter 10 illustrated in FIG. 1 will be described. The series arm resonator s2 is a second series arm resonance circuit that is provided on a path that connects the series arm resonator s1 and the input/output terminal 11n. That is, the series arm resonator s2 is a resonator that is provided in a series arm that connects the input/output terminal 11m and the input/output terminal 11n. The series arm resonator s2 is provided closest to the input/output terminal 11n among the two or more series arm resonance circuits (here, series arm resonators s1 and s2). Not limited to the series arm resonator s2, a series arm resonance circuit composed of one or more acoustic wave resonators may be provided in this series arm.

In this embodiment, the series arm resonator s1 is provided closest to the input/output terminal 11m among the series arm resonators s1 and s2. Furthermore, the node x1 is located on the input/output terminal 11m side of the series arm resonator s1 and the node x2 is located on the input/output terminal 11n side of the series arm resonator s2. That is, the node x1 is the node that is closest to the input/output terminal 11m and the node x2 is the node that is closest to the input/output terminal 11n among the nodes on the path connecting the input/output terminal 11m and input/output terminal 11n.

The parallel arm resonator p5 is a fifth parallel arm resonator that is connected between a node between the node x1 and the node x2 (node x3 in FIG. 16), and ground among the nodes on the path that connects the input/output terminal 11m and the input/output terminal 11n. In other words, the parallel arm resonator p5 is a resonator that is provided in a parallel arm that connects the node x3 on the series arm and ground to each other.

In this embodiment, the capacitor C5 is a fifth impedance element that is serially connected to the parallel arm resonator p5.

The switch SW5 is a fifth switch that has one terminal that is connected to a connection node between the parallel arm resonator p5 and the capacitor C5, and another terminal that is connected to ground.

The capacitor C5 and the switch SW5 are connected in parallel with each other and thereby form a pair of elements, and this pair of elements consisting of the capacitor C5 and the switch SW5 is connected to the parallel arm resonator p5 between the parallel arm resonator p5 and ground.

The inductor L5 is for example a fifth inductor provided on a path that connects the parallel arm resonator p5 and ground to each other via the switch SW5. The inductor L5 is for example a wiring line (fifth wiring line) on a path that connects the parallel arm resonator p5 and ground to each other via the switch SW5. Specifically, the fifth wiring line is a wiring line that connects a connection node between the parallel arm resonator p5 and the capacitor C5, and the switch SW5 to each other.

The parallel arm resonator p5, the capacitor C5, the switch SW5, and the inductor L5 form the fifth parallel arm resonance circuit that is connected between the node x3, which is on the path (on the series arm) that connects the input/output terminal 11m and the input/output terminal 11n to each other, and ground. In other words, the fifth parallel arm resonance circuit is provided in one parallel arm that connects the series arm and ground to each other.

In the fifth parallel arm resonance circuit, the frequency at which the impedance is minimum and the frequency at which the impedance is maximum are both shifted toward the low-frequency side or the high-frequency side in accordance with whether the switch SW5 is in a conductive state or a non-conductive state. In other words, the fifth parallel arm resonance circuit can change the pass band of the filter 30 together with the first parallel arm resonance circuit and the second parallel arm resonance circuit.

Next, filter characteristics of the filter 30 according to this embodiment will be described.

Figure 17:
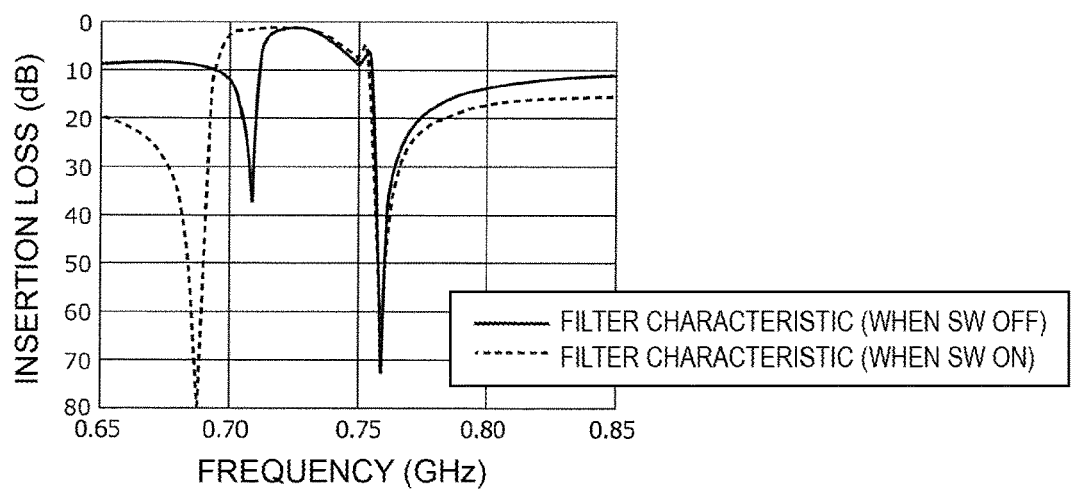
FIG. 17 is a graph illustrating the filter characteristics of a filter of embodiment 3 when the switches are in a conductive state and a non-conductive state.

FIG. 17 is a graph illustrating the filter characteristics of the filter 30 of embodiment 3 when the switches are in a conductive state and a non-conductive state. "When the switches are in a conductive state" refers to a time when the switches SW1, SW2, and SW5 are all in a conductive state, and "when the switches are in a non-conductive state" refers to a time when the switches SW1, SW2, and SW5 are all in a non-conductive state.

In the filter 30, the resonant frequencies of the parallel arm resonators p1, p2, and p5 are lower than the resonant frequencies of the series arm resonators s1 and s2 and the anti-resonant frequencies of the parallel arm resonators p1, p2, and p5 are lower than the anti-resonant frequencies of the series arm resonators s1 and s2. In addition, the resonant frequencies of the parallel arm resonators p1, p2, and p5 are substantially equal, and the anti-resonant frequencies of the parallel arm resonators p1, p2, and p5 are substantially equal. Furthermore, the capacitance values of the capacitors C1, C2, and C5 are substantially equal, and the first inductance value, the second inductance value, and the inductance value of the inductor L5 (referred to as fifth inductance value) are substantially equal. In the case where the filter 30 includes a plurality of fifth parallel arm resonance circuits, at least one inductance value of the inductor L5 of at least one fifth parallel arm resonance circuit may be substantially equal to the first inductance value and the second inductance value.

As described above, when the switches SW1, SW2, and SW5 are in a non-conductive state, as the bandpass characteristic of the filter 30, a second bandpass characteristic illustrated by the solid line in FIG. 17 is obtained in which the first resonant frequency is substantially the resonant frequency of the combined characteristic of the parallel arm resonator p1 and the capacitor C1, the second resonant frequency is the resonant frequency of the combined characteristic of the parallel arm resonator p2 and the capacitor C2, and the fifth resonant frequency is the resonant frequency of the combined characteristic of the parallel arm resonator p5 and the capacitor C5.

On the other hand, as described above, when the switches SW1, SW2, and SW5 are in a conductive state, as the bandpass characteristic of the filter 30, a first bandpass characteristic illustrated by the broken line in FIG. 17 is obtained in which the first resonant frequency is the resonant frequency of the combined characteristic of the parallel arm resonator p1 and the inductor L1, the second resonant frequency is the resonant frequency of the combined characteristic of the parallel arm resonator p2 and the inductor L2, and the fifth resonant frequency is the resonant frequency of the combined characteristic of the parallel arm resonator p5 and the inductor L5.

As illustrated in the figure, when the switches SW1, SW2, and SW5 are in a conductive state, the attenuation amount of the attenuation band on the low-frequency side of the pass band can be made larger. Furthermore, the attenuation amount of an attenuation band can be made larger compared with the case where the attenuation band is formed of two attenuation poles by forming the attenuation band using three attenuation poles.

In this embodiment, the duplexer 50 is configured such that one terminal of the filter 30 and one terminal of the filter 40 are connected to each other forming a common terminal, but a multiplexer may be configured such that terminals of two or more filters are connected to each other so as to form a common terminal. The terminals of the filters constituting the multiplexer may be directly connected to each other or may be connected to each other via a phase shifter, a switch, or a circulator. In addition, in the case where the terminals of the filters are connected to each other via a switch, the pass bands of the filters may overlap.

Embodiment 4

The filters (acoustic wave filter devices) described in the above embodiments and modifications can be applied to a multiplexer, a radio-frequency front end circuit, and so forth. In addition, a multiplexer (duplexer, triplexer, quadplexer, or the like) to which a filter described in any of the above embodiments and modifications has been applied is included in the scope of a filter (acoustic wave filter device) of the present disclosure. In other words, both a filter as a stand-alone unit described in any of the above embodiments and modifications and a multiplexer to which such a filter is applied is regarded as a filter (acoustic wave filter device) of the present disclosure.

A radio-frequency front end circuit will be described in this embodiment.

Figure 18:
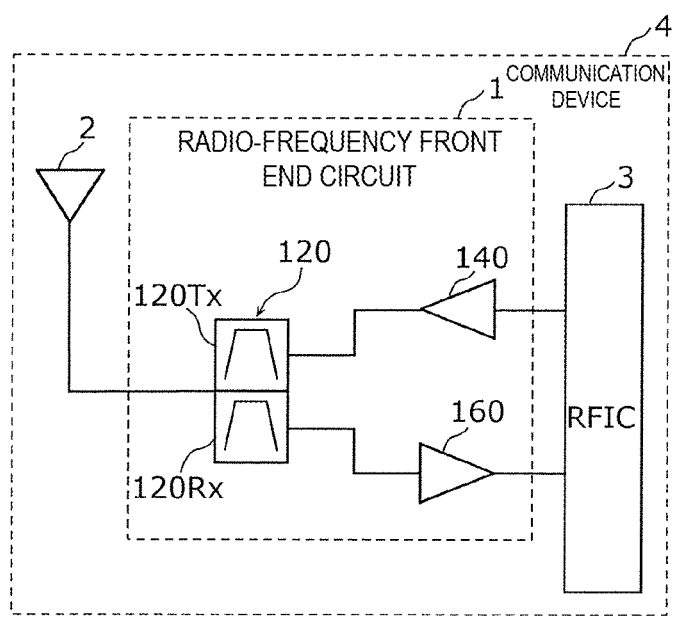
FIG. 18 is a configuration diagram of a radio-frequency front end circuit according to embodiment 4 and circuits peripheral thereto.

FIG. 18 is a circuit configuration diagram of a radio-frequency front end circuit 1 according to embodiment 4 and circuits peripheral thereto. The figure illustrates the radio-frequency front end circuit 1, an antenna element 2, and an RF signal processing circuit (RFIC) 3. The radio-frequency front end circuit 1 and the RFIC 3 form a communication device 4. The antenna element 2, the radio-frequency front end circuit 1, and the RFIC 3 are arranged in the front end unit of a cellular phone that supports multiple modes and/or multiple bands, for example.

The antenna element 2 is an antenna that transmits and receives radio-frequency signals and supports multiple bands in accordance with a communication standard such as LTE, for example. The antenna element 2 does not need to support all of the bands of the communication device 4 and may support just the bands of a low frequency band group or a high frequency band group, for example. Furthermore, the antenna element 2 may be provided separate to the communication device 4 rather than being built into the communication device 4.

The radio-frequency front end circuit 1 is a circuit that transmits a radio-frequency signal between the antenna element 2 and the RFIC 3. Specifically, the radio-frequency front end circuit 1 transmits a radio-frequency signal output from the RFIC 3 (here, radio-frequency transmission signal) to the antenna element 2 via a transmission signal path. In addition, the radio-frequency front end circuit 1 transmits a radio-frequency signal received via the antenna element 2 (here, radio-frequency reception signal) to the RFIC 3 via a reception signal path.

The radio-frequency front end circuit 1 includes a duplexer 120, a transmission amplification circuit 140, and a reception amplification circuit 160.

The duplexer 120 is a multiplexer that includes a transmission filter 120Tx and a reception filter 120 Rx and includes an acoustic wave filter device as described above as at least one of these filters. Antenna-side input/output terminals of the transmission filter 120Tx and the reception filter 120 Rx are connected together and connected to the antenna element 2 and the other terminals of the filters are respectively connected to the transmission amplification circuit 140 and the reception amplification circuit 160.

The transmission amplification circuit 140 is a power amplifier that amplifies the power of a radio-frequency transmission signal output from the RFIC 3.

The reception amplification circuit 160 is a low-noise amplifier that amplifies the power of a radio-frequency reception signal received by the antenna element 2.

The RFIC 3 is an RF signal processing circuit that processes radio-frequency signals transmitted and received by the antenna element 2. Specifically, the RFIC 3 performs signal processing using down conversion and so forth on a radio-frequency signal input from the antenna element 2 via the reception signal path of the radio-frequency front end circuit 1 (in this case, radio-frequency reception signal), and outputs a reception signal generated through this signal processing to a baseband signal processing circuit (not illustrated). In addition, the RFIC 3 performs signal processing using up conversion and so forth on a transmission signal input from the base band signal processing circuit, and outputs a radio-frequency signal generated through this signal processing (in this case, radio-frequency transmission signal) to the transmission signal path of the radio-frequency front end circuit 1.

The radio-frequency front end circuit 1 includes an acoustic wave filter device as described above, and consequently is capable of increasing the band width and increasing the attenuation amount of an attenuation band when the pass band is switched. Therefore, this is particularly useful in the radio-frequency front end circuit 1 applied to the communication device 4 that supports multiple bands.

Modification of Embodiment 4

The filters (acoustic wave filter devices) described in the above embodiments and modifications can be applied to a radio-frequency front end circuit that supports a system having a greater number of utilized bands than the radio-frequency front end circuit 1 according to embodiment 4. Accordingly, such a radio-frequency front end circuit will be described in this modification.

Figure 19:
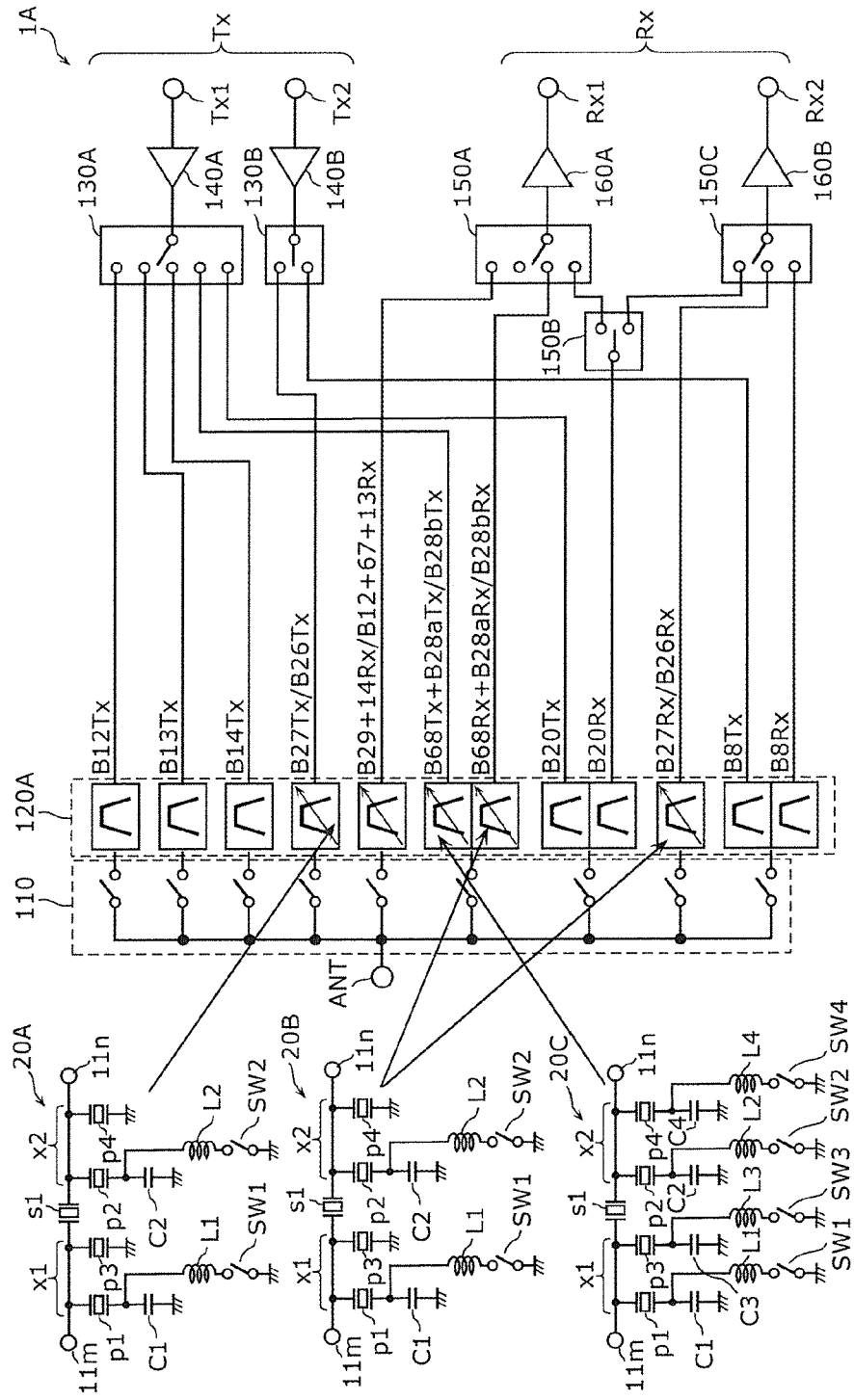
FIG. 19 is a configuration diagram of a radio-frequency front end circuit according to a modification of embodiment 4.

FIG. 19 is a configuration diagram of a radio-frequency front end circuit 1A according to a modification of embodiment 4.

As illustrated in the figure, the radio-frequency front end circuit 1A has an antenna terminal ANT, transmission terminals Tx1 and Tx2, and reception terminals Rx1 and Rx2, and includes, in order from the antenna terminal ANT side, a switch group 110 formed of a plurality of switches, a filter group 120A formed of a plurality of filters, transmission switches 130A and 130B, reception switches 150A, 150B, and 150C, transmission amplification circuits 140A and 140B, and reception amplification circuits 160A and 160B.

The switch group 110 connects the antenna terminal ANT and signal paths corresponding to prescribed bands in accordance with a control signal from a control unit (not illustrated) and is formed of a plurality of SPST switches, for example. The configuration is not limited to only one signal path being connected to the antenna terminal ANT, and a plurality of signal paths may be connected to the antenna terminal ANT. In other words, the radio-frequency front end circuit 1A may support carrier aggregation.

The filter group 120A is formed of a plurality of filters (including duplexers) in which the following bands are included in the pass bands thereof. Specifically, the bands are (i) Band 12 transmission band, (ii) Band 13 transmission band, (iii) Band 14 transmission band, (iv) Band 27 (or Band 26) transmission band, (v) Band 29 and Band 14 (or Band 12, Band 67, and Band 13) reception band, (vi-Tx) Band 68 and Band 28a (or Band 68 and Band 28b) transmission band, (vi-Rx) Band 68 and Band 28a (or Band 68 and Band 28b) reception band, (vii-Tx) Band 20 transmission band, (vii-Rx) Band 20 reception band, (viii) Band 27 (or Band 26) reception band, (ix-Tx) Band 8 transmission band, and (ix-Rx) Band 8 reception band.

The transmission switch 130A is a switch circuit having a plurality of selection terminals that are connected to a plurality of transmission signal paths on the low band side and having a common terminal that is connected to the transmission amplification circuit 140A. The transmission switch 130B is a switch circuit having a plurality of selection terminals that are connected to a plurality of transmission signal paths on the high band side and having a common terminal that is connected to the transmission amplification circuit 140B. The transmission switches 130A and 130B are provided in a stage prior to the filter group 120A (here, stage prior to transmission signal paths) and are switch circuits in which a connection state thereof is switched in accordance with a control signal from a control unit (not illustrated). Thus, radio-frequency signals (here, radio-frequency transmission signals) amplified by the transmission amplification circuits 140A and 140B are output from the antenna terminal ANT to the antenna element 2 (refer to FIG. 18) after passing through prescribed filters of the filter group 120A.

The reception switch 150A is a switch circuit having a plurality of selection terminals that are connected to a plurality of reception signal paths on the low band side and having a common terminal that is connected to the reception amplification circuit 160A. The reception switch 150B is a switch circuit having a common terminal that is connected to a reception signal path of a prescribed band (here, Band 20) and having two selection terminals that are connected to a common terminal of the reception switch 150A and a common terminal of the reception switch 150B. The reception switch 150C is a switch circuit having a plurality of selection terminals that are connected to a plurality of reception signal paths on the high band side and having a common terminal that is connected to the reception amplification circuit 160B. These reception switches 150A to 150C are provided in a stage subsequent to the filter group 120A (here, stage subsequent to reception signal paths), and the connection states thereof are switched in accordance with a control signal from the control unit (not illustrated). Thus, radio-frequency signals input to the antenna terminal ANT (here, radio-frequency reception signals) pass through prescribed filters of the filter group 120A, are amplified by the reception amplification circuits 160A and 160B and are output to the RFIC 3 (refer to FIG. 18) from the reception terminals Rx1 and Rx2. An RFIC that supports low bands and an RFIC that supports high bands may be individually provided.

The transmission amplification circuit 140A is a power amplifier that amplifies the power of a low-band radio-frequency transmission signal and the transmission amplification circuit 140B is a power amplifier that amplifies the power of a high-band radio-frequency transmission signal.

The reception amplification circuit 160A is a low-noise amplifier that amplifies the power of a low-band radio-frequency reception signal and the reception amplification circuit 160B is a low-noise amplifier that amplifies the power of a high-band radio-frequency reception signal.

The thus-configured radio-frequency front end circuit 1A includes the filter 20A according to application example 1 of embodiment 2 as a filter having the (iv) Band 27 (or Band 26) transmission band in the pass band thereof. That is, the pass band of the filter is switched between the Band 27 transmission band and the Band 26 transmission band in accordance with a control signal.

Furthermore, the radio-frequency front end circuit 1A includes the filter 20B according to application example 2 of embodiment 2 as a reception filter having the (vi-Rx) Band 68 and Band 28a (or Band 68 and Band 28b) reception band in the pass band thereof and includes the filter 20C according to application example 3 of embodiment 2 as a transmission filter having the (vi-Tx) Band 68 and Band 28a (or Band 68 and Band 28b) transmission band in the pass band thereof. In other words, the pass band of a duplexer formed of this transmission filter and this reception filter is switched between the Band 68 and Band 28a transmission band and the Band 68 and Band 28b transmission band and is switched between the Band 68 and Band 28a reception band and the Band 68 and Band 28b reception band in accordance with a control signal.

In addition, the radio-frequency front end circuit 1A includes the filter 20B according to application example 2 of embodiment 2 as a filter having the (viii) Band 27 (or Band 26) reception band in the pass band thereof. That is, the pass band of the filter is switched between the Band 27 transmission band and the Band 26 transmission band in accordance with a control signal.

The thus-configured radio-frequency front end circuit 1A includes the filters 20A to 20C (acoustic wave filter devices) according to application examples 1 to 3 of embodiment 2 described above, and consequently the number of filters can be reduced compared with the case where a filter is provided for each band, and therefore a reduction in size can be realized.

In addition, the radio-frequency front end circuit 1A according to this embodiment includes the transmission switches 130A and 130B and the reception switches 150A to 150C (switch circuits) provided in a stage prior to or subsequent to the filter group 120A (plurality of acoustic wave filter devices). Thus, common signal paths can be used for parts of the signal paths along which radio-frequency signals propagate. Therefore, for example, the transmission amplification circuits 140A and 140B or the reception amplification circuits 160A and 160B (amplification circuits) can be commonly used to support a plurality of acoustic wave filter devices. Therefore, the radio-frequency front end circuit 1A can be reduced in size and cost.

It is sufficient that at least one of the transmission switches 130A and 130B and the reception switches 150A to 150C be provided. Furthermore, the number of transmission switches 130A and 130B and the number of reception switches 150A to 150C are not limited to the numbers described above, and one transmission switch and one reception switch may be provided, for example. In addition, the numbers of selection terminals and so forth of the transmission switches and reception switches are also not limited to the numbers given in this embodiment, and may each be 2, for example.

Furthermore, the configurations of the filters according to embodiment 1 and the modification thereof may be applied to at least one filter among a plurality of filters included in a filter group.

Other Embodiments

The acoustic wave filter devices and radio-frequency front end circuits according to embodiments of the present disclosure described above have been described in the form of embodiments 1 to 4 and modifications thereof, but the present disclosure is not limited to these embodiments and modifications. Other embodiments realized by combining any of the constituent elements of the above-described embodiments and modifications with one another, modifications obtained by modifying the above-described embodiments in various ways, as thought of by one skilled in the art, without departing from the gist of the present disclosure, and various devices having an acoustic wave filter device and a radio-frequency front end circuit of the present disclosure built thereinto are also included in the present disclosure.

For example, the communication device 4 including the radio-frequency front end circuit and the RFIC 3 (RF signal processing circuit) described above is also included in the present disclosure. Low loss and high selectability can be realized by the communication device 4.

In addition, for example, an inductor provided on a path that connects a parallel arm resonator and ground via a switch is not limited to be a wiring line that connects a connection node between the parallel arm resonator and a capacitor, and a switch or to being a wiring line that connects the parallel arm resonator and a connection node between the switch and the capacitor, and may instead be a wiring line that connects the switch and ground to each other.

Furthermore, for example, in embodiment 3, the inductance values of the inductors of the three parallel arm resonance circuits of the filter 30 are substantially equal to one another, but it is sufficient that the inductance values of the inductors of at least two parallel arm resonance circuits among the three parallel arm resonance circuits be substantially equal to each other.

In addition, for example, in embodiment 3, the filter 30 includes two series arm resonance circuits and three parallel arm resonance circuits, but not limited to this, may instead include three or more series arm resonance circuits and four or more parallel arm resonance circuits. Furthermore, it is sufficient that the inductance values of the inductors of at least two parallel arm resonance circuits among four or more parallel arm resonance circuits be substantially equal to each other. In addition, the attenuation amount of the attenuation band can be made larger when the pass band is switched by making the inductance values of the inductors of three or more parallel arm resonance circuits substantially equal to each other.

Furthermore, all of the resonators or some of the resonators described above are not limited to being acoustic wave resonators that utilize surface acoustic waves, and for example, may instead be formed of acoustic wave resonators that utilize bulk waves or boundary acoustic waves. In other words, all of the resonators or some of the resonators described above do not have to be formed of IDT electrodes. Also, in the case of an acoustic wave filter device including such resonators, the attenuation amount of the attenuation band can be increased when the pass band is switched.

Furthermore, in the above embodiment, the multiplexer (duplexer) includes a transmission filter and a reception filter but may instead include just a transmission filter or just a reception filter.

In addition, for example, inductors and capacitors may be connected between constituent elements of such a radio-frequency front end circuit or communication device. Such inductors may include wiring line inductors formed by wiring lines connecting the constituent elements.

INDUSTRIAL APPLICABILITY

The present disclosure can be widely used in communication devices such as cellular phones in the form of small-sized filters, multiplexers, front end circuits, and communication devices that can be applied to multi-band systems.

REFERENCE SIGNS LIST 1, 1A radio-frequency front end circuit
2 antenna element
3 RF signal processing circuit (RFIC)
4 communication device
10, 10A, 20A-20D, 30, 40, 200A-200D filter (acoustic wave filter device)
111 input/output terminal
11m input/output terminal (first input/output terminal)
11n input/output terminal (second input/output terminal)
12-15 chip
16 wiring substrate
17 component mounting surface
18 wiring layer
50, 120 duplexer (multiplexer)
101 IDT electrode
101a, 101b interdigital electrode
101g adhesive layer
101h main electrode layer
102 piezoelectric substrate
103 protective layer
110a, 110b electrode finger
111a, 111b busbar electrode
120A filter group
120Rx reception filter
120Tx transmission filter
130A, 130B transmission switch
140, 140A, 140B transmission amplification circuit
150A-150C reception switch
160, 160A, 160B reception amplification circuit
p1-p5 parallel arm resonator
s1, s2 series arm resonator (series arm resonance circuit)
x1-x3 node
C1-C5 capacitor (impedance element)
L1-L5 inductor
SW1-SW5 switch (switch element)

The invention claimed is:

1. An acoustic wave filter device comprising:
a first series arm resonance circuit provided on a path that connects a first input/output terminal and a second input/output terminal to each other;
a first parallel arm resonance circuit that is connected between a first node, which is closer to the first input/output terminal than the first series arm resonance circuit, and ground among a plurality of nodes on the path that connects the first input/output terminal and the second input/output terminal to each other; and a second parallel arm resonance circuit that is connected between a second node, which is closer to the second input/output terminal than the first series arm resonance circuit, and ground among the plurality of nodes on the path that connects the first input/output terminal and the second input/output terminal to each other, wherein the first parallel arm resonance circuit includes:

a first parallel arm resonator that is connected to the first node, a first pair of elements consisting of a first impedance element and a first switch connected in parallel with each other, said first pair of elements being connected in series with the first parallel arm resonator between the first node and ground, and a first inductor connected in parallel to the first impedance element and connected to ground via the first switch, the second parallel arm resonance circuit includes:

a second parallel arm resonator that is connected to the second node, a second pair of elements consisting of a second impedance element and a second switch connected in parallel with each other, said second pair of elements being connected in series with the second parallel arm resonator between the second node and ground, and a second inductor connected in parallel to the second impedance element and connected to ground via the second switch, and wherein an inductance value of the first inductor and an inductance value of the second inductor are substantially equal to each other.

2. The acoustic wave filter device according to claim 1, further comprising:

a third parallel arm resonance circuit that is connected in parallel with the first parallel arm resonance circuit between the first node and ground; and a fourth parallel arm resonance circuit that is connected in parallel with the second parallel arm resonance circuit between the second node and ground;

wherein the third parallel arm resonance circuit includes a third parallel arm resonator that is connected to the first node, the fourth parallel arm resonance circuit includes a fourth parallel arm resonator that is connected to the second node, a resonant frequency of the first parallel arm resonator is different from a resonant frequency of the third parallel arm resonator, and a resonant frequency of the second parallel arm resonator is different from a resonant frequency of the fourth parallel arm resonator.

3. The acoustic wave filter device according to claim 2, wherein the resonant frequency of the first parallel arm resonator is higher than the resonant frequency of the third parallel arm resonator, and the resonant frequency of the second parallel arm resonator is higher than the resonant frequency of the fourth parallel arm resonator.

4. The acoustic wave filter device according to claim 2, wherein the resonant frequency of the first parallel arm resonator is lower than the resonant frequency of the third parallel arm resonator, and the resonant frequency of the second parallel arm resonator is lower than the resonant frequency of the fourth parallel arm resonator.

5. The acoustic wave filter device according to claim 2, wherein the third parallel arm resonance circuit further includes:

a third pair of elements consisting of a third impedance element and a third switch connected in parallel with each other, said third pair of elements being connected in series with the third parallel arm resonator between the first node and ground, and a third inductor that is provided on a path that connects the first node and ground to each other via the third switch, and the fourth parallel arm resonance circuit further includes:

a fourth pair of elements consisting of a fourth impedance element and a fourth switch connected in parallel with each other, said fourth pair of elements being connected in series with the fourth parallel arm resonator between the second node and ground, and a fourth inductor that is provided on a path that connects the second node and ground to each other via the fourth switch.

6. The acoustic wave filter device according to claim 5, wherein an inductance value of the third inductor and an inductance value of the fourth inductor are substantially equal to each other.

7. The acoustic wave filter device according to claim 1, further comprising:

a third parallel arm resonator that is connected in parallel with the first parallel arm resonator between the first node and ground; and a fourth parallel arm resonator that is connected in parallel with the second parallel arm resonator between the second node and ground, wherein the first pair of elements is connected in series with a circuit in which the first parallel arm resonator and the third parallel arm resonator are connected in parallel with each other, the second pair of elements is connected in series with a circuit in which the second parallel arm resonator and the fourth parallel arm resonator are connected in parallel with each other, a resonant frequency of the first parallel arm resonator is different from a resonant frequency of the third parallel arm resonator, and a resonant frequency of the second parallel arm resonator is different from a resonant frequency of the fourth parallel arm resonator.

8. The acoustic wave filter device according to claim 1, wherein the first inductor is a first wiring line on a path that connects the first parallel arm resonator and ground to each other via the first switch, and the second inductor is a second wiring line on a path that connects the second parallel arm resonator and ground to each other via the second switch.

9. The acoustic wave filter device according to claim 8, further comprising:

a wiring substrate;

wherein at least one out of the first wiring line and the second wiring line is partially provided on the wiring substrate or inside the wiring substrate.

10. The acoustic wave filter device according to claim 9, wherein the first parallel arm resonator and the second parallel arm resonator are provided on a first chip, and the first switch and the second switch are provided on a second chip that is different from the first chip, wherein the first chip and the second chip are provided on the wiring substrate or inside the wiring substrate, terminals, which respectively correspond to the first parallel arm resonator and the second parallel arm resonator of the first chip, are arrayed along one edge of the first chip, and terminals, which respectively correspond to the first switch and the second switch of the second chip, are arrayed along one edge of the second chip.

11. The acoustic wave filter device according to claim 10, wherein the terminals, which respectively correspond to the first parallel arm resonator and the second parallel arm resonator of the first chip, and the terminals, which respectively correspond to the first switch and the second switch of the second chip, face each other.

12. The acoustic wave filter device according to claim 9, wherein at least one of the first inductor and the second inductor are chip inductors mounted on the wiring substrate.

13. The acoustic wave filter device according to claim 8, wherein the inductance value of the first inductor and the inductance value of the second inductor are substantially equal to each other as a result of a length and a width of the first wiring line and a length and a width of the second wiring line being substantially equal to each other.

14. The acoustic wave filter device according to claim 1, further comprising:
a second series arm resonance circuit provided on a path that connects the first series arm resonance circuit and the second input/output terminal to each other; and
a fifth parallel arm resonance circuit that is connected between a third node, which is provided on a path that connects the first series arm resonance circuit and the second series arm resonance circuit to each other, and ground;
wherein the second node is located on a path that connects the second series arm resonance circuit and the second input/output terminal to each other,
the fifth parallel arm resonance circuit includes:
a fifth parallel arm resonator that is connected to the third node,
a fifth pair of elements consisting of a fifth impedance element and a fifth switch, which are connected in parallel with each other, said fifth pair of elements being connected in series with the fifth parallel arm resonator between the third node and ground, and
a fifth inductor that is provided on a path that connects the third node and ground to each other via the fifth switch.

15. The acoustic wave filter device according to claim 14, wherein an inductance value of the fifth inductor is substantially equal to the inductance value of the first inductor and the inductance value of the second inductor.

16. A multiplexer comprising:
at least one transmission filter; and
at least one reception filter;
wherein at least one out of the at least one transmission filter and the at least one reception filter is the acoustic wave filter device according to claim 14.

17. A radio-frequency front end circuit comprising:
the acoustic wave filter device according to claim 14; and
an amplification circuit.

18. A radio-frequency front end circuit comprising:
the acoustic wave filter device according to claim 1; and
an amplification circuit.

19. A communication device comprising:
an RF signal processing circuit that processes a radio-frequency signal transmitted or received by an antenna element; and
the radio-frequency front end circuit according to claim 18, which transmits the radio-frequency signal between the antenna element and the RF signal processing circuit.

20. The acoustic wave filter device according to claim 1, wherein the first impedance element and the second impedance element are capacitors or inductors.

* * * * *